United States Patent
Yokoyama et al.

(10) Patent No.: US 10,964,404 B2
(45) Date of Patent: Mar. 30, 2021

(54) SEMICONDUCTOR DEVICE

(71) Applicant: RENESAS ELECTRONICS CORPORATION, Tokyo (JP)

(72) Inventors: Yoshisato Yokoyama, Tokyo (JP); Shinji Tanaka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/540,788

(22) Filed: Aug. 14, 2019

(65) Prior Publication Data

US 2020/0075115 A1 Mar. 5, 2020

(30) Foreign Application Priority Data

Sep. 3, 2018 (JP) .............................. JP2018-164782

(51) Int. Cl.
| | | |
|---|---|---|
| *G11C 7/00* | (2006.01) | |
| *G11C 29/18* | (2006.01) | |
| *G11C 7/22* | (2006.01) | |
| *G11C 29/12* | (2006.01) | |
| *G11C 29/26* | (2006.01) | |

(52) U.S. Cl.
CPC ................ *G11C 29/18* (2013.01); *G11C 7/22* (2013.01); *G11C 2029/1202* (2013.01); *G11C 2029/1802* (2013.01); *G11C 2029/2602* (2013.01)

(58) Field of Classification Search
CPC ... G11C 29/18; G11C 7/22; G11C 2029/1202; G11C 2029/1802
USPC .............................. 365/201, 230.03, 230.06
See application file for complete search history.

(56) References Cited

U.S. PATENT DOCUMENTS

| | | | | |
|---|---|---|---|---|
| 4,638,462 A | * | 1/1987 | Rajeevakumar | ......... G11C 7/12 365/189.07 |
| 5,526,322 A | * | 6/1996 | Lee | ......... G11C 16/26 365/185.06 |
| 5,867,449 A | * | 2/1999 | Casper | ......... G11C 7/14 365/230.06 |
| 6,219,290 B1 | * | 4/2001 | Chang | ......... G11C 7/062 365/185.21 |
| 6,741,510 B2 | | 5/2004 | Ohbayashi et al. | |
| 7,154,808 B2 | * | 12/2006 | Shim | ......... G11C 8/12 365/230.04 |
| 8,125,837 B2 | * | 2/2012 | Yamaoka | ......... G11C 11/412 365/189.07 |
| 9,455,008 B2 | * | 9/2016 | Choi | ......... G11C 8/12 |
| 2008/0273403 A1 | * | 11/2008 | Ehrenreich | ...... G11C 29/50012 365/194 |

(Continued)

FOREIGN PATENT DOCUMENTS

JP 2003-249099 A 9/2003

*Primary Examiner* — Viet Q Nguyen
(74) *Attorney, Agent, or Firm* — McDermott Will & Emery LLP

(57) ABSTRACT

A semiconductor device capable of detecting whether test operation is normal is provided. The semiconductor device includes a plurality of memory cells arranged in a matrix, a plurality of word lines provided corresponding to each of the rows of the plurality of memory cells respectively, a decoder for generating driving signals for driving the plurality of word lines, and a detection circuit provided between the plurality of word lines and the decoder for simultaneously raising the plurality of word lines by test operation and detecting whether or not the rising state of the plurality of word lines is normal.

12 Claims, 16 Drawing Sheets

(56) References Cited

U.S. PATENT DOCUMENTS

| | | | |
|---|---|---|---|
| 2013/0051137 A1* | 2/2013 | Zeng | G11C 13/0061 |
| | | | 365/163 |
| 2014/0063974 A1* | 3/2014 | Yang | G11C 16/08 |
| | | | 365/185.23 |
| 2019/0325919 A1* | 10/2019 | Bhargava | G11C 7/1078 |
| 2019/0325961 A1* | 10/2019 | Jaiswal | G11C 14/0081 |

* cited by examiner

SEMICONDUCTOR DEVICE

CROSS-REFERENCE TO RELATED APPLICATIONS

The disclosure of Japanese Patent Application No. 2018-164782 filed on Sep. 3, 2018 including the specification, drawings and abstract is incorporated herein by reference in its entirety.

BACKGROUND

The present disclosure relates to a semiconductor device.

SRAM (Static Random Access Memory) and DRAM (Dynamic Random Access Memory) have been put into practical use as a semiconductor memory device for storing data in a high-capacity semiconductor memory. These semiconductor memory devices are shipped after judging the non-defective semiconductor/defective semiconductor. The non-defective/defective discrimination is performed by actually inputting/outputting data to/from the memory cell included in the semiconductor storage device, confirming that the write data coincides with the read data, and applying stress by burn-in. Recently, however, as the capacitance of the semiconductor memory device has been increased, the number of regions where stress has to be applied has increased, resulting in longer burn-in testing times, resulting in higher costs. In order to solve such a problem, it has been disclosed in Japanese unexamined Patent Application publication No. 2003-249099 that a plurality of word lines are simultaneously selected and stress is applied during a burn-in test.

SUMMARY

After examination of Japanese unexamined Patent Application publication No. 2003-249099 by the inventor, the following problem is found.

In the semiconductor memory device of Japanese unexamined Patent Application publication No. 2003-249099, it is not possible to detect whether test operation is normal. The present invention has been made to solve the above-mentioned problems, and provides a semiconductor device capable of detecting whether or not test operation is normal.

Other objects and novel features will become apparent from the description of this specification and the accompanying drawings.

A semiconductor device according to an aspect of the present disclosure includes a plurality of memory cells arranged in a matrix, a plurality of word lines provided corresponding to each of the rows of the plurality of memory cells respectively, and a decoder for generating a driving signal for driving the plurality of word lines. The semiconductor device includes a detection circuit provided between the plurality of word lines and the decoder, and simultaneously raising the plurality of word lines by a test operation and detecting whether or not the rising state of the plurality of word lines is normal.

According to one Embodiment, the disclosed semiconductor device is capable of detecting abnormality in a test operation by providing a detection circuit.

DETAILED DESCRIPTION

Figure 1:
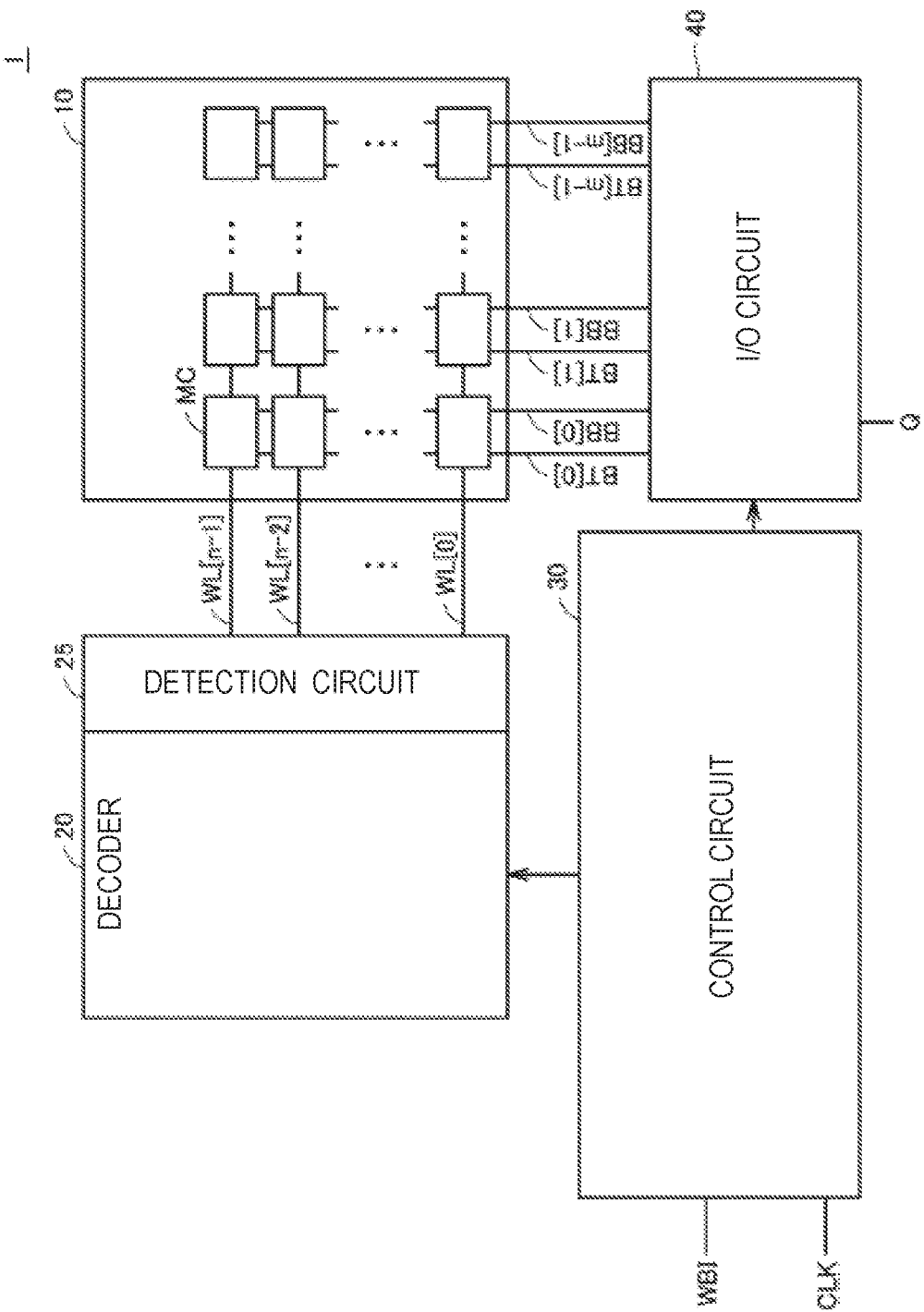
FIG. 1 is a diagram illustrating a semiconductor device 1 according to a first embodiment.

The embodiments will be described in detail with reference to the drawings. In the drawings, the same or equivalent components are denoted by the same reference numerals, and description thereof will not be repeated.

First Embodiment

FIG. 1 is a diagram illustrating a semiconductor device 1 according to a first embodiment.

Referring to FIG. 1, a semiconductor device 1 according to the first embodiment includes a memory array 10 having a plurality of memory cells MC arranged in a matrix, a decoder 20 for driving a plurality of word lines WL provided corresponding to each of the rows of the plurality of memory cells respectively, a detection circuit 25 provided between the decoder 20 and the word lines WL, a control circuit 30 for controlling the entire semiconductor device 1, and an I/O circuit 40.

As an example, the memory array 10 includes n word lines WL[0] to WL[n−1] and m sets of bit line pairs BT[0] to BT[m−1], BB[0] to BB[m−1].

The m pairs of bit lines are connected to the I/O circuit 40, and output data Q. The control circuit 30 receives an input of the control command WBI for executing a burn-in operation and a clock signal CLK and operates in response to an input of a control command WBI. The control circuit 30 outputs various control signal to respective circuits.

Figure 2:
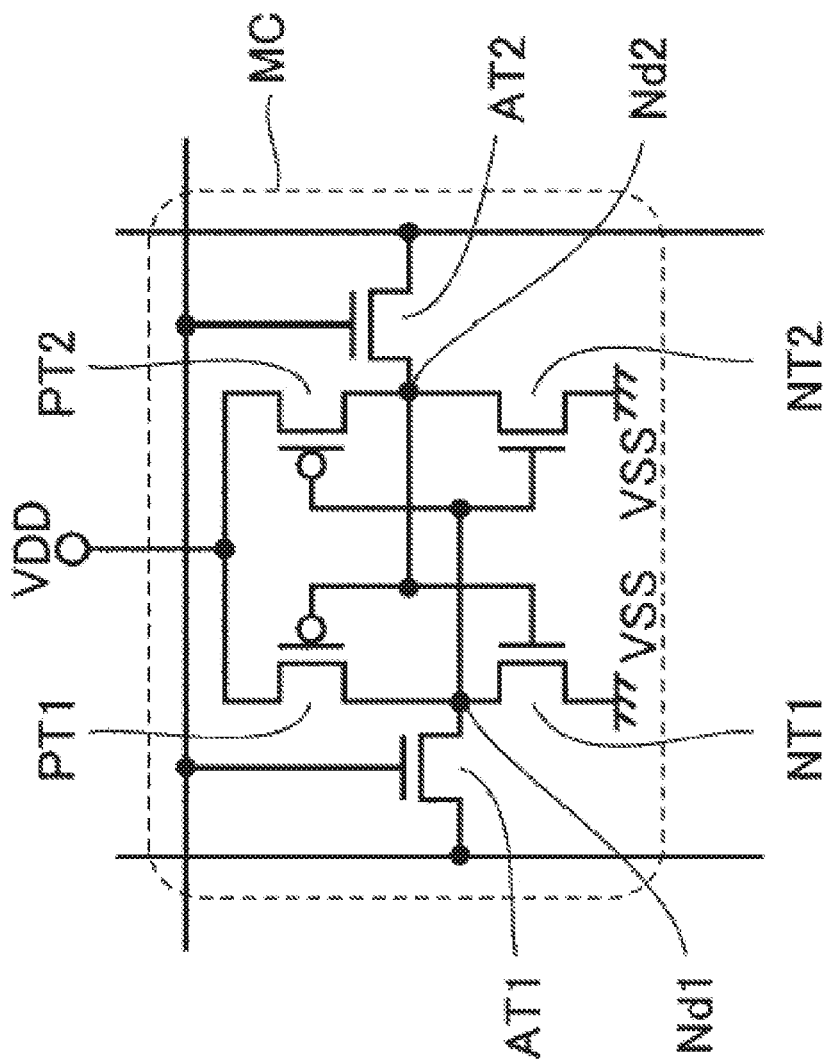
FIG. 2 is a diagram illustrating a memory cell MC according to a first embodiment.

FIG. 2 is a diagram illustrating a memory cell MC according to the first embodiment. Referring to FIG. 2, the memory cell MC includes an access transistor AT1, AT2, a driver transistor NT1, NT2, and a load transistor PT1, PT2.

The access transistor AT1 is provided between the bit line BT and an internal node Nd1, and its gate is connected to the word line WL.

The access transistor AT2 is provided between the bit line BB and an internal node Nd2, and its gate is connected to the word line WL.

The load transistor PT1 is provided between a power supply voltage VDD and the internal node Nd1, and its gate is connected to the internal node Nd2.

The load transistor PT2 is provided between the power supply voltage VDD and the internal node Nd2, and its gate is connected to the internal node Nd1.

The driver transistor NT1 is provided between a ground voltage VSS and the internal node Nd1, and its gate is connected to the internal node Nd2.

The driver transistor PT2 is provided between the ground voltage VSS and the internal node Nd2, and its gate is connected to the internal node Nd1.

Figure 3:
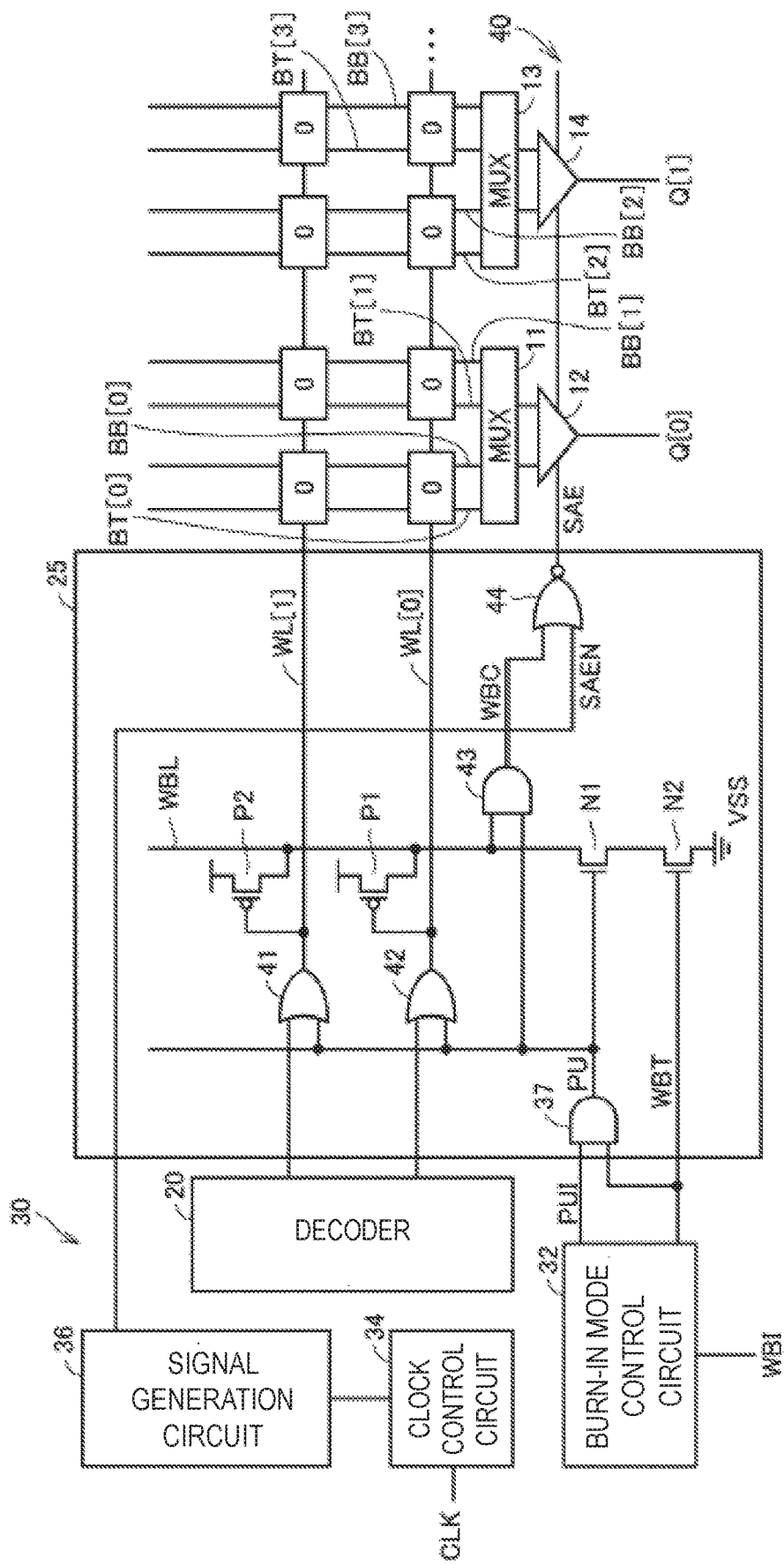
FIG. 3 is a diagram illustrating a configuration of a peripheral circuit of a memory array 10 according to a first embodiment.

FIG. 3 is a diagram illustrating a configuration of a peripheral circuit of the memory array 10 according to the first embodiment.

Referring to FIG. 3, memory array 10 includes a plurality of memory cells MC in a matrix. In this example, it is assumed that data "0" is stored in advance in the plurality of memory cells MC.

The I/O circuit 40 is provided with multiplexers and sense amplifiers corresponding to every two memory cell columns.

As an example, a case is shown in which the multiplexer 11 and the sense amplifier 12 are provided corresponding to the bit line pairs BT[0], BB[0], BT[1], and BB[1]. A multiplexer 13 and a sense amplifier 14 are provided corresponding to the bit line pair BT[2], BB[2], BT[3], and BB[3]. Since the other bit line pairs have the same configuration, detailed description thereof will not be repeated.

Multiplexers 11 and 13 select one of two bit line pairs to connect to sense amplifiers 12 and 14, respectively. The multiplexers 11 and 13 select the odd-numbered bit line pair or the even-numbered bit line pair according to an instruction, and connect the selected bit line pair to the sense amplifier.

Sense amplifiers 12 and 14 are activated in accordance with a control signal SAE to perform a read operation.

Specifically, the sense amplifiers 12 and 14 are connected to the bit line pair through a multiplexer MUX, and output read data Q by differential amplification. In this example, the sense amplifiers 12 and 14 output read data Q[0] and Q[1].

The control circuit 30 includes a burn-in mode control circuit 32, a clock control circuit 34, and a signal generation circuit 36.

The clock control circuit 34 outputs a timing signal to the signal generation circuit 36 in accordance with an input of the clock signal CLK.

The signal generation circuit 36 outputs a control signal SAEN in accordance with an input of timing signals from the clock control circuit 34 in a read operation.

The burn-in mode control circuit 32 receives a command WBI instructing to execute a burn-in operation, and outputs control signals PU and WBT.

The detection circuit 25 includes a plurality of OR circuits provided corresponding to the word lines WL respectively, a P-channel MOS transistor, a detection signal wiring WBL, N-channel MOS transistors N1 and N2, a NOR circuit 44, and an AND circuit 37.

As an example, the OR circuits 41 and 42 and the P-channel MOS transistors P1 and P2 are provided corresponding to the word lines WL[0] and WL[1], respectively.

The same applies to the other word lines WL. The OR circuits 41 and 42 drive the word lines WLs based on a decode signal from the decoder 20 or an input of the control signal PU.

All word lines WL are set to rising state in accordance with an input of the control signal PU ("H" levels).

The detection signal wiring WBL is connected to the ground voltage VSS via N-channel MOS transistors N1 and N2 connected in series.

N-channel MOS transistors N1 and N2 receive inputs of control signals PU and WBT, respectively.

The AND circuit 43 receives the detection signal from the detection signal wiring WBL and the control signal PU, and outputs an AND logical operation result as a control signal WBC.

NOR circuit 44 outputs a NOR logical operation result of the control signal WBC and the control signal SAEN from the signal generation circuit 36 as a control signal SAE.

P-channel MOS transistors P1 and P2 are provided between power supply voltage VDD and detection signal wiring WBL, and their gates are connected to corresponding word lines WL.

AND circuit 37 receives an input of the control signal WBT and the control signal PUI, and outputs an AND logical operation result as a control signal PU.

In this example, a burn-in operation for the word lines WL[0] and WL[1] will be described.

Figure 4:
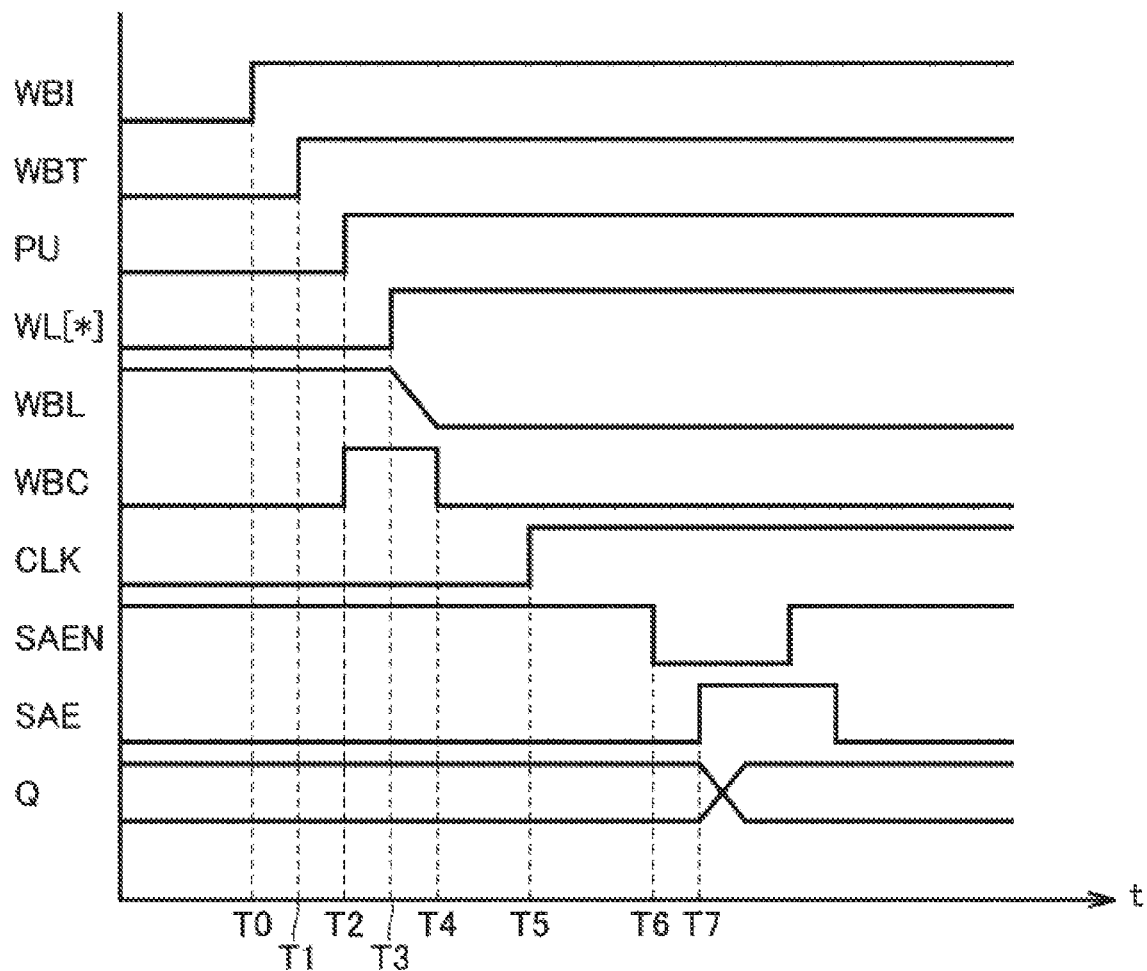
FIG. 4 is a timing chart illustrating the burn-in operation (normal operation) of the semiconductor device 1 according to the first embodiment.

FIG. 4 is a timing chart for explaining a burn-in operation (normal operation) of the semiconductor device 1 according to the first embodiment.

Referring to FIG. 4, at time T0, the burn-in mode control circuit 32 receives a command WBI ("H" level).

At time T1, the burn-in mode control circuit 32 sets the control signal WBT to "H" according to an input of the command WBI. Although not shown, the control signal PUI is set to "H" level.

At time T2, the AND-circuit 37 sets the control signal PU to the "H" level based on the control signal WBT ("H" level) and the control signal PUI ("H" level). In response to this, the AND-circuit 43 sets the control signal WBC ("H" level).

At time T3, the OR circuits 41 and 42 set the word lines WL[0] and WL[1] in accordance with the control signal PU ("H" level). That is, all word lines WL are set to rising state.

Accordingly, the P-channel MOS transistors P1 and P2 are turned off. Further, in this case, since the control signals PU and WBT are set to "H" level, the detection signal wiring WBL is connected to the ground voltage VSS.

After the time T3, the detection signal wiring WBL gradually starts to fall to the "L" level. At time T4, the AND circuit 43 outputs control signal WBC ("L" level) based on the AND logical operation result between the control signal PU and the detection signal according to the potential of the detection signal wiring WBL.

Next, at time T5, the clock signal CLK is set to "H" level. Accordingly, at time T6, the signal generation circuit 36 sets the control signal SAEN to "L" level.

Accordingly, at time T7, the NOR circuit 44 outputs the control signal SAE (H level) based on the NOR logical operation result of the control signal SAEN (L level) and the control signal WBC (L level).

The sense amplifiers 12 and 14 output the read data Q[0] and the read data Q[1] based on the input of the control signal SAE ("H" level).

Figure 5:
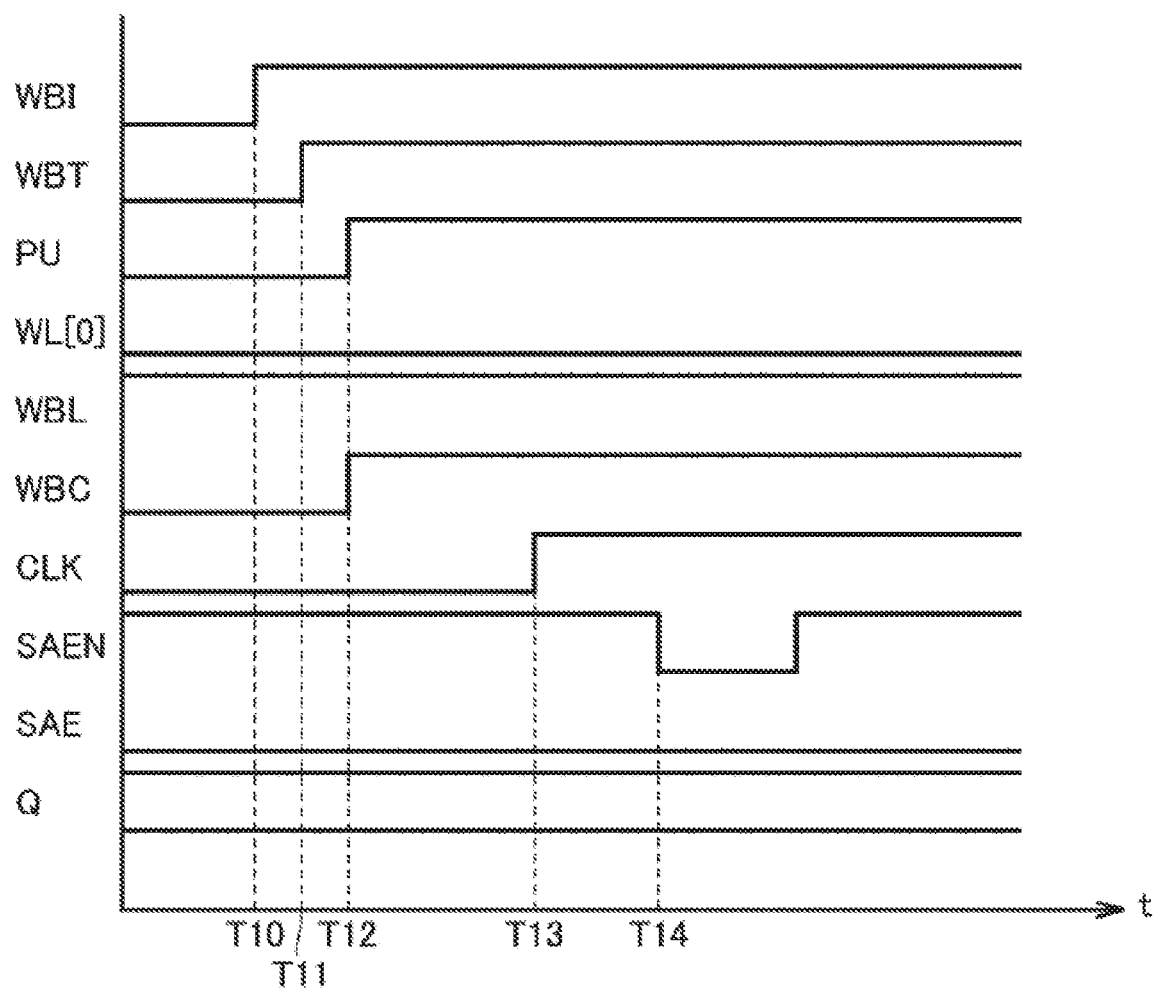
FIG. 5 is a timing chart illustrating the burn-in operation (abnormal operation) of the semiconductor device 1 according to the first embodiment.

In this example, data "0" is output. FIG. 5 is a timing chart for explaining a burn-in operation (abnormal operation) of the semiconductor device 1 according to the first embodiment.

Referring to FIG. 5, at time T10, the burn-in mode control circuit 32 receives a command WBI ("H" level).

At time T10, the burn-in mode control circuit 32 sets the control signal WBT to "H" level according to the input of the command WBI. Although not shown, the control signal PUI is set to "H" level.

At time T11, the AND-circuit 37 sets the control signal PU to the "H" level based on the control signal WBT ("H" level) and the control signal PUI. In response to this, the AND-circuit 43 sets the control signal WBC ("H" level).

At time T12, the OR circuits 41 and 42 set the word lines WL[0] and WL[1] in accordance with the control signal PU ("H" levels). That is, all word lines WL are set to rising state.

On the other hand, a case in which the word line WL[0] is not turned rising state is shown here.

Accordingly, the P-channel MOS transistor P1 is maintained in the ON state. Since the control signals PU and WBT are set to "H" level, the detection signal wiring WBL is connected to the ground voltage VSS.

However, since the P-channel MOS transistor P1 is turned on, the detection signal wiring WBL does not drop to the "L" level and maintains the "H" level.

Therefore, the AND circuit 43 outputs the control signal WBC ("H" level) based on the AND logical operation result between the control signal PU and the detection signal according to the potential of the detection signal wiring WBL.

Next, at time T13, the clock signal CLK is set to "H" level. Accordingly, at time T14, the signal generation circuit 36 sets the control signal SAEN to "L" level.

However, the NOR circuit 44 outputs the control signal SAE ("L" level) based on the NOR logical operation result of the control signal SAEN ("L" level) and the control signal WBC ("H" level).

Therefore, sense amplifiers 12 and 14 are not activated and read data Q[0] and Q[1] are not output.

Therefore, when there is an abnormality in the burn-in operation by using the detection circuit 25 according to the first embodiment, the control signal SAEs for activating the sense amplifiers are not activated. As a result, it can be easily detected that the burn-in operation is not normal because the read data is not outputted from the sense amplifier.

Figure 6:
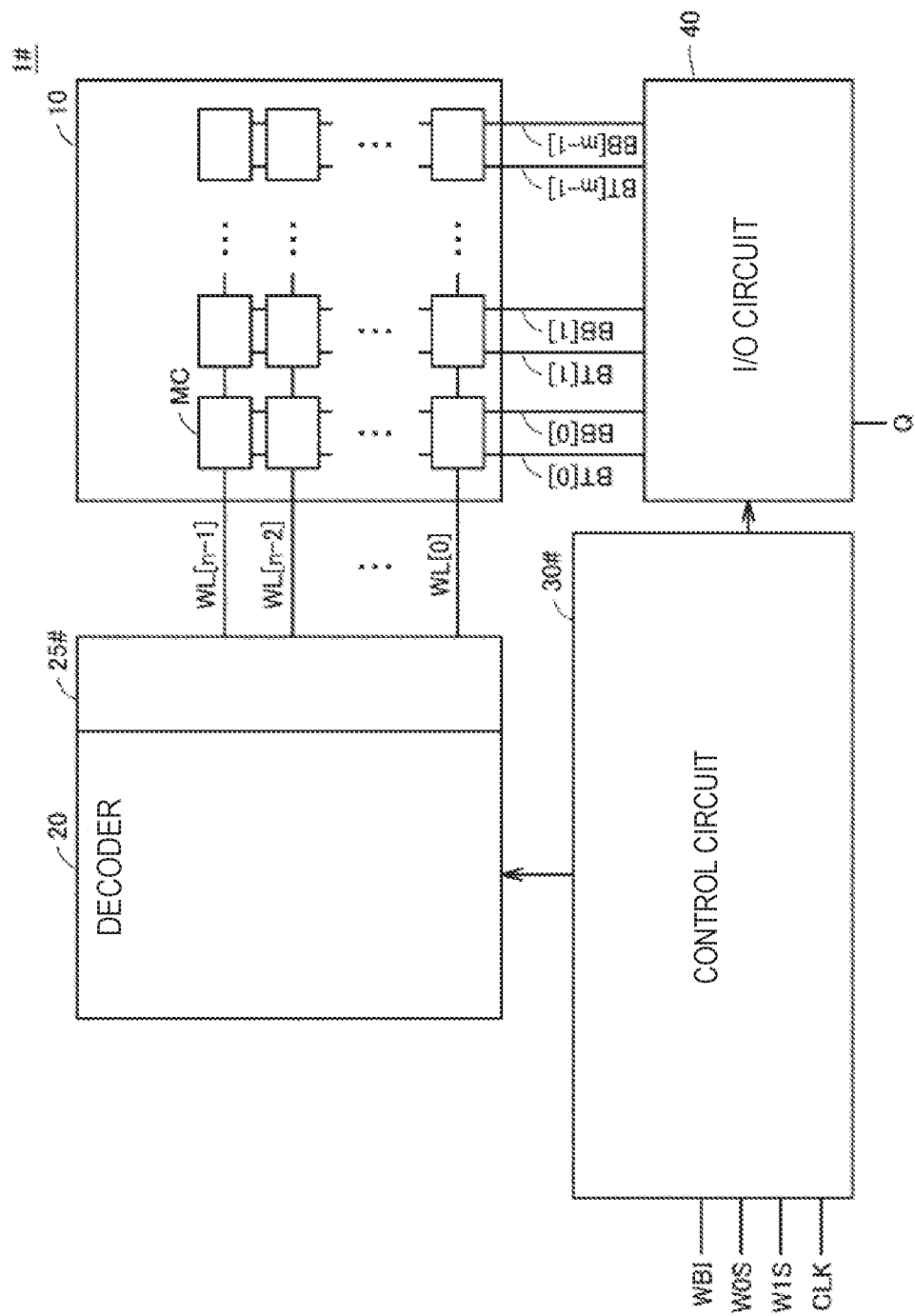
FIG. 6 is a diagram illustrating a semiconductor device 1# according to a second embodiment.

FIG. 6 is a diagram illustrating the semiconductor device 1# according to the second embodiment.

Referring to FIG. 6, semiconductor device 1# according to Embodiment 2 differs from semiconductor device 1 described in Embodiment 1 in that detection circuit 25 and control circuit 30 are replaced with detection circuit 25# and control circuit 30#. Other forms are the same as those described in the first embodiment, and therefore detailed description thereof will not be repeated.

The control circuit 30# receives an input of the control command WBI for executing the burn-in operation and the clock signal CLK and operates in response to the input of the control command WBI. The control circuit 30 outputs various control signals to the respective circuits. In the present embodiment, the control circuit 30 receives inputs of control signal W0S and W1S for switching the burn-in operation of even rows and odd rows.

Figure 7:
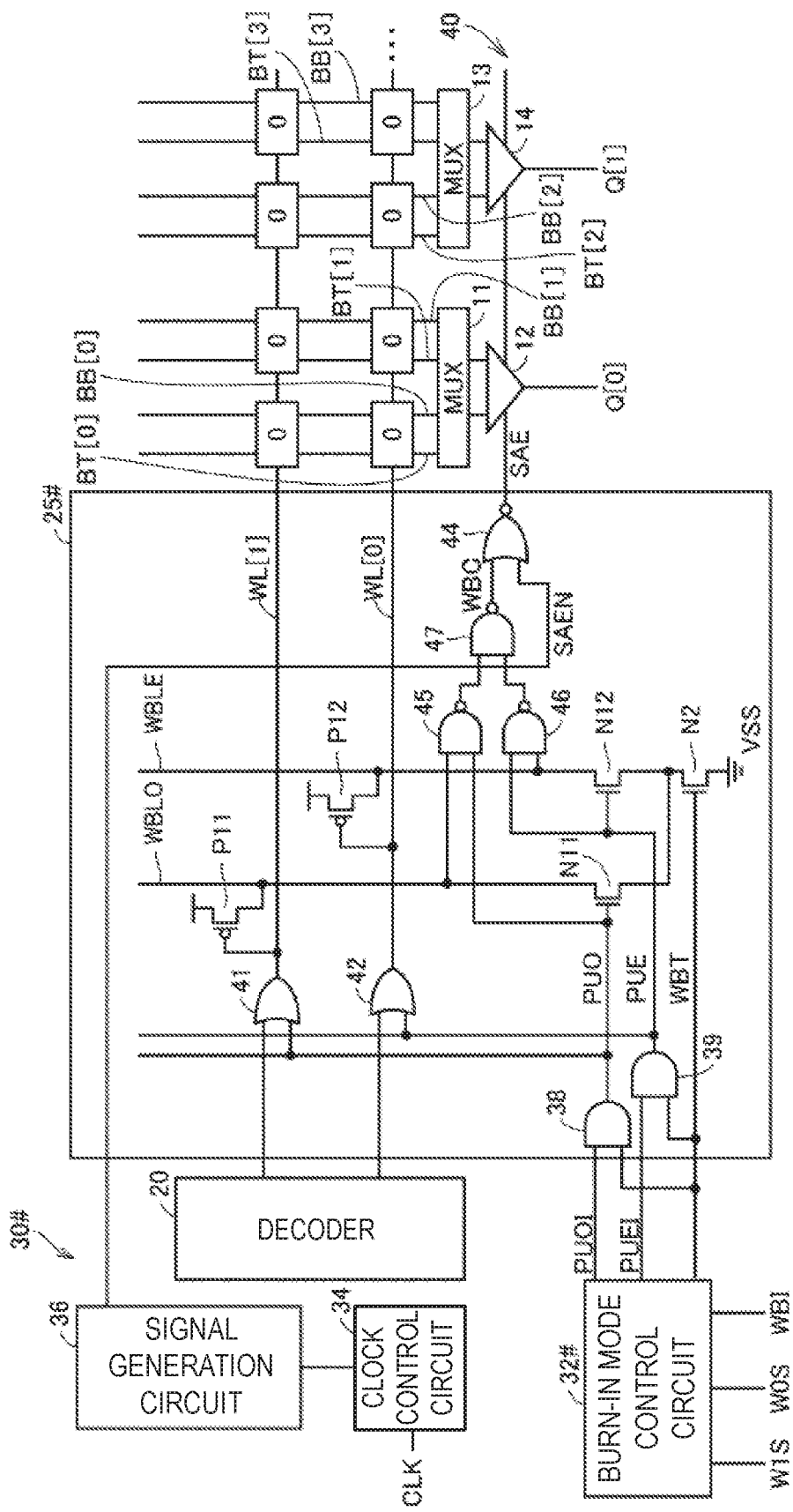
FIG. 7 is a diagram illustrating a configuration of a peripheral circuit of a memory array 10 according to a second embodiment.

FIG. 7 is a diagram illustrating a configuration of a peripheral circuit of the memory array 10 according to the second embodiment.

Referring to FIG. 7, memory array 10 includes a plurality of memory cells MC in a matrix. In this example, it is assumed that data "0" is stored in advance in the plurality of memory cells MC.

Since the configuration of the I/O circuit 40 is the same as that described in the first embodiment, detailed descriptions thereof will not be repeated.

The control circuit 30# is provided with a burn-in mode control circuit 32# replaced with the burn-in mode control circuit 32.

The burn-in mode control circuit 32# receives commands WBI and control signal W0S and W1S instructing to execute the burn-in operation, and outputs control signal PUO, PUE, and WBT.

Specifically, burn-in mode control circuit 32# sets control signal PUE ("H" level) based on inputs of command WBI ("H" level) and control signal W0S ("H" level).

The burn-in mode control circuit 32# sets the control signal PUO (H level) based on the inputs of the command WBI (H level) and control signal W1S (H level).

The detection circuit 25# includes a plurality of OR circuits provided corresponding to the word lines WL respectively, a P-channel MOS transistor, detection signal wirings WBLO and WBLE, N-channel MOS transistors N2, N11 and N12, a NOR circuit 44, a NAND circuits 45 to 47, and AND circuits 38 and 39.

In this embodiment, OR circuits are separately provided corresponding to word lines of odd rows and even rows, respectively.

For example, an OR-circuit 42 and P-channel MOS transistor P12 are provided corresponding to the word line WL[0] of the even row.

An OR-circuit 41 and a P-channel MOS transistor P11 are provided corresponding to the odd row word-line WL[1].

The other word lines of even rows and odd rows are similarly provided with OR-circuits and P-channel MOS transistors.

The OR circuits 41 and 42 drive the word lines WLs based on a decode signal from a decoders 20 or an input of a control signal PUO or PUE.

The OR circuit provided corresponding to the word line WL of the odd row sets the odd word line WL of all the word lines WL to rising state in accordance with an input of the control signal PUO ("H" level).

The OR circuit provided corresponding to the word line WL of the even row sets the even word line WL of all the word lines WL to rising state in accordance with an input of the control signal PUE ("H" levels).

A detection signal wiring WBLO is connected to a ground voltage VSS via N-channel MOS transistors N11 and N2 connected in series.

A detection signal wiring WBLE is connected to a ground voltage VSS via N-channel MOS transistors N12 and N2 connected in series.

N-channel MOS transistors N11 and N12 receive inputs of control signal PUO and PUE, respectively.

N-channel MOS transistor N2 receives an input of control signal WBT. A NAND circuit 45 receives a detection signal from the detection signal wiring WBLO and the control signal PUO, and outputs the NAND logical operation result to the NAND circuit 47.

A NAND circuit 46 receives a detection signal from the detection signal wiring WBLE and the control signal PUE, and outputs a result of a NAND logical operation to the NAND circuit 47.

A NAND circuit 47 outputs a NAND logical operation result of the output signals of the NAND circuits 45 and 46 as a control signal WBC.

A NOR circuit 44 outputs a NOR logical operation result of a control signal WBC and a control signal SAEN from a signal generation circuit 36 as a control signal SAE.

A P-channel MOS transistor P11 is provided between a power voltage VDD and a detection signal wiring WBLO and the gate is connected to the corresponding odd row word line WL.

A P-channel MOS transistor P12 is provided between the power supply voltage VDD and the detection signal wiring WBLE, and the gate is connected to the word line WL of the corresponding even row.

The AND circuit 38 receives inputs of the control signal WBT and the control signal PUOI, and outputs an AND logical operation result as the control signal PUO.

The AND circuit 39 receives inputs of the control signal WBT and the control signal PUOE, and outputs an AND logical operation result as a control signal PUE.

In this example, a burn-in operation for the word lines WL[0] and WL[1] will be described.

Figure 8:
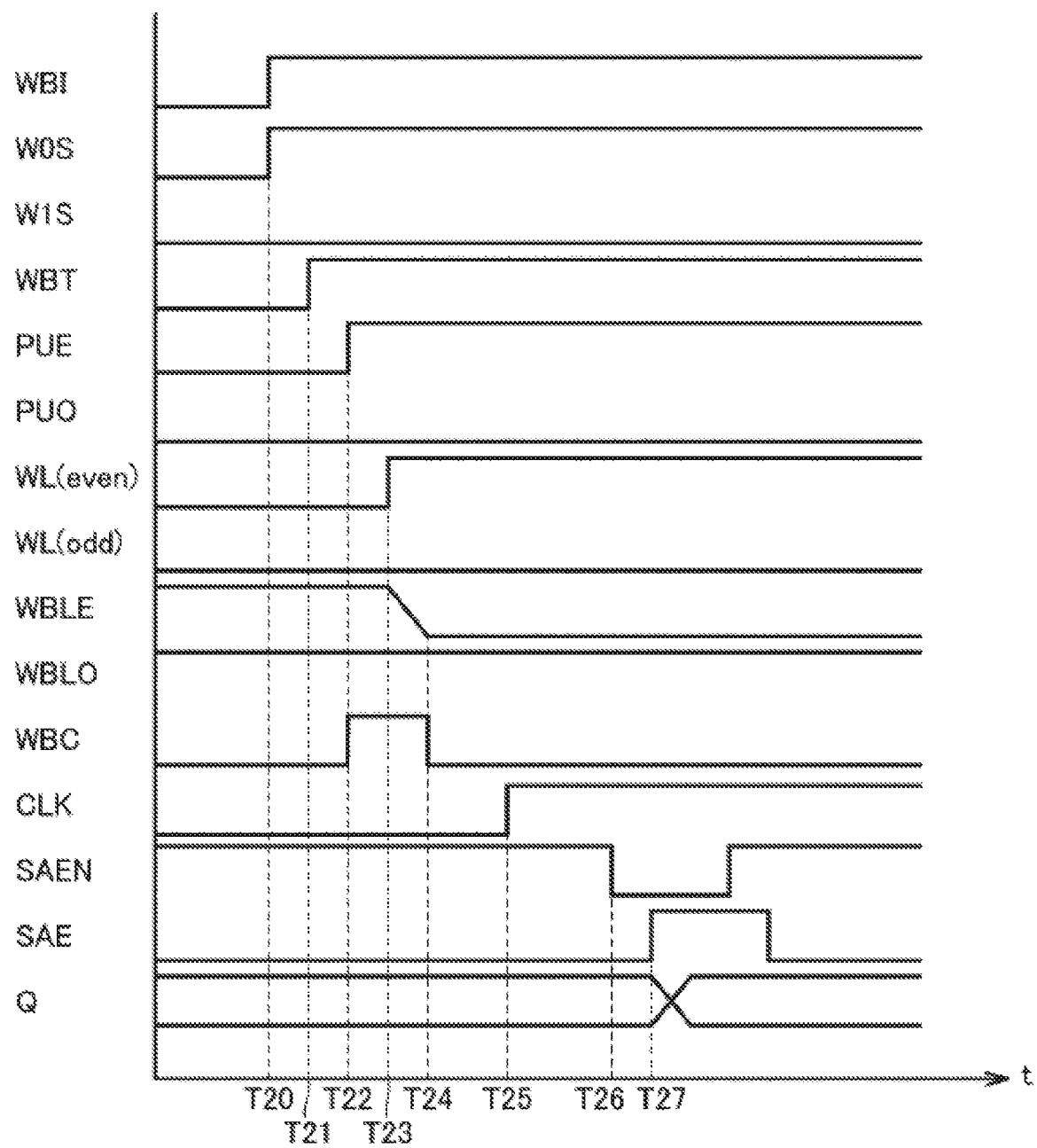
FIG. 8 is a timing chart illustrating a burn-in operation (normal operation) of the semiconductor device 1# according to the second embodiment.

FIG. 8 is a timing chart for explaining the burn-in operation (normal operation) of the semiconductor device 1# according to the second embodiment.

Referring to FIG. 8, at time T20, burn-in mode control circuit 32 receives commands WBI and control signal W0S.

At time T21, the burn-in mode control circuit 32 sets the control signal WBT to the "H" level in accordance with the inputs of the commands WBI ("H" level) and control signal W0S ("H" level). Although not shown, the control signal PUEI is set to "H" level.

At time T22, the AND-circuit 39 sets the control signal PUE to the "H" level based on the control signal WBT ("H" level) and the control signal PUEI ("H" level). Control signal PUO maintains "L" level.

In response to this, the NAND circuit 46 outputs an "L" level signal to the NAND circuit 47 based on the NAND logical operation result between the detected signal of the detection signal wiring WBLE and the control signal PUE.

The NAND circuit 47 sets the control signal WBC ("H" level) in accordance with the input of the "L" level signal from the NAND circuit 46.

At time T23, the OR circuit 42 sets the word line WL[0] ("H" level) corresponding to an even row in accordance with the control signal PUE ("H" level). That is, the even row word lines WL of all the word lines WL are set to rising state.

Accordingly, the P-channel MOS transistor P12 is turned off. In this instance, since the control signal PUE and WBT are set to "H" levels, the detection signal wiring WBLE is connected to the ground voltage VSS.

After the time T23, the detection signal wiring WBLE gradually starts to fall to the "L" level. At time T24, the NAND circuit 46 outputs a "H" level signal to the NAND circuit 47 based on the result of the NAND logical operation between the detection signal according to the potential of the detection signal wiring WBLE and the control signal PUE. The NAND circuit 47 receives "H" level signals from the NAND circuits 45 and 46 and outputs control signal WBCs ("L" level signals).

Next, at time T25, the clock signal CLK is set to "H" level. Accordingly, at time T26, the signal generation circuit 36 sets the control signal SAEN to "L" level.

Accordingly, at time T27, the NOR circuit 44 outputs the control signal SAE (H level) based on the NOR logical operation result of the control signal SAEN (L level) and the control signal WBC (L level).

The sense amplifiers 12 and 14 output the read data Q[0] and the read data Q[1] based on the input of the control signal SAE ("H" levels).

Figure 9:
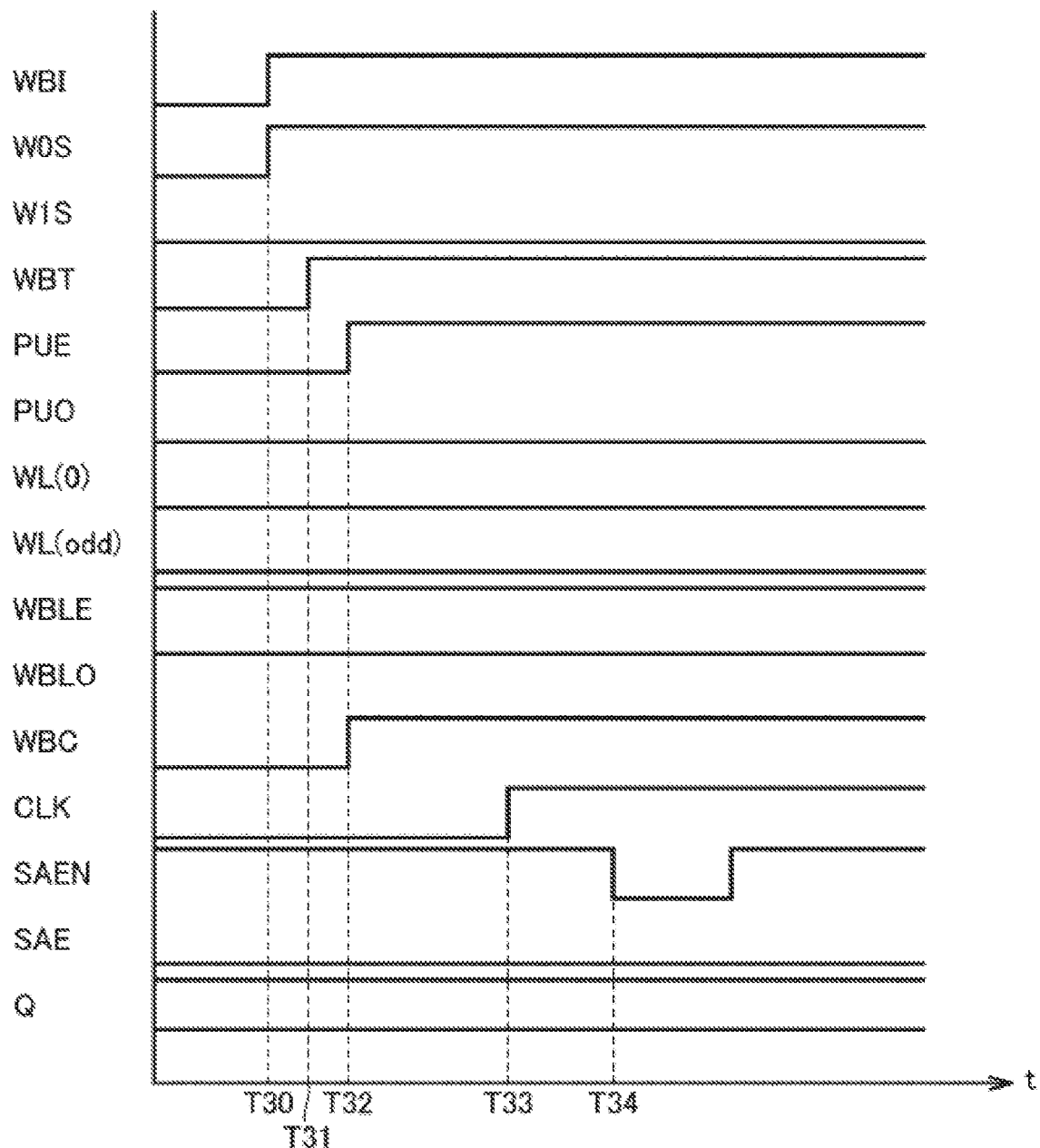
FIG. 9 is a timing chart illustrating a burn-in operation (abnormal operation) of the semiconductor device 1# according to the second embodiment.

In this example, data "0" is output. FIG. 9 is a timing chart for explaining the burn-in operation (abnormal operation) of the semiconductor device 1# according to the second embodiment.

Referring to FIG. 9, at time T30, burn-in mode control circuit 32 receives command WBI and control signal W0S.

At time T31, the burn-in mode control circuit 32 sets the control signal WBT to the "H" level in accordance with the inputs of the command WBI ("H" level) and control signal W0S ("H" level). Although not shown, the control signal PUEI is set to "H" level.

At time T32, the AND-circuit 39 sets the control signal PUE to the "H" level based on the control signal WBT ("H" level) and the control signal PUEI ("H" level). Control signal PUO maintains "L" levels.

In response to this, the NAND circuit 46 outputs an "L" level signal to the NAND circuit 47 based on the NAND logical operation result between the detected signal of the detection signal wiring WBLE and the control signal PUE.

The NAND circuit 47 sets the control signal WBC ("H" level) in accordance with the input of the "L" level signal from the NAND circuit 46.

At time T33, the OR circuit 42 sets the word line WL[0] ("H" level) corresponding to an even row in accordance with the control signal PUE ("H" level). That is, the even row word lines WL of all the word lines WL are set to rising state.

On the other hand, a case in which the word line WL[0] is not turned rising state is shown here.

Accordingly, the P-channel MOS transistor P12 is maintained in the ON state. Since the control signal PUE and WBT are set to "H" levels, the detection signal wiring WBLE is connected to the ground voltage VSS.

However, because the P-channel MOS transistor P12 is on, the detection signal wiring WBLE maintains an "H" level without lowering to the "L" level.

Therefore, the NAND circuit 46 outputs to the NAND circuit 47 a signal of "L" level based on a NAND logical operation result between the detection signal according to the potential of the detection signal wiring WBLE and the control signal PUE.

The NAND circuit 47 receives the signal of the "L" level from the NAND circuit 46 and outputs the signal of the control signal WBC (the signal of the "H" level).

Next, at time T33, the clock signal CLK is set to "H" level. Accordingly, at time T34, the signal generation circuit 36 sets the control signal SAEN to "L" level.

However, the NOR circuit 44 outputs the control signal SAE ("L" level) based on a NOR logical operation result of the control signal SAEN ("L" level) and the control signal WBC ("H" level).

Therefore, sense amplifiers 12 and 14 are not activated and read data Q[0] and Q[1] are not output.

Although the burn-in operation for the even row word lines WL has been described above, the same applies to the odd row word lines WL.

Therefore, by using the detection circuit 25 according to the second embodiment, when there is an abnormality in the burn-in operation on the word lines WL of the odd rows or even rows, the control signal SAE for activating the sense amplifier is not activated. As a result, it can be easily detected that the burn-in operation is not normal because the read data is not outputted from the sense amplifier.

Third Embodiment

In the second embodiment described above, a configuration in which the burn-in operation for the word line WL of the odd rows or even rows can be performed separately has been described.

On the other hand, as an abnormal condition of the burn-in operation, although the burn-in operation is performed on the word lines WL of the odd rows, there is a possibility that a load is applied to the word lines WL of the even rows, or a load is applied to the word lines WL of the odd rows even though the burn-in operation is performed on the word lines WL of the even rows.

Figure 10:
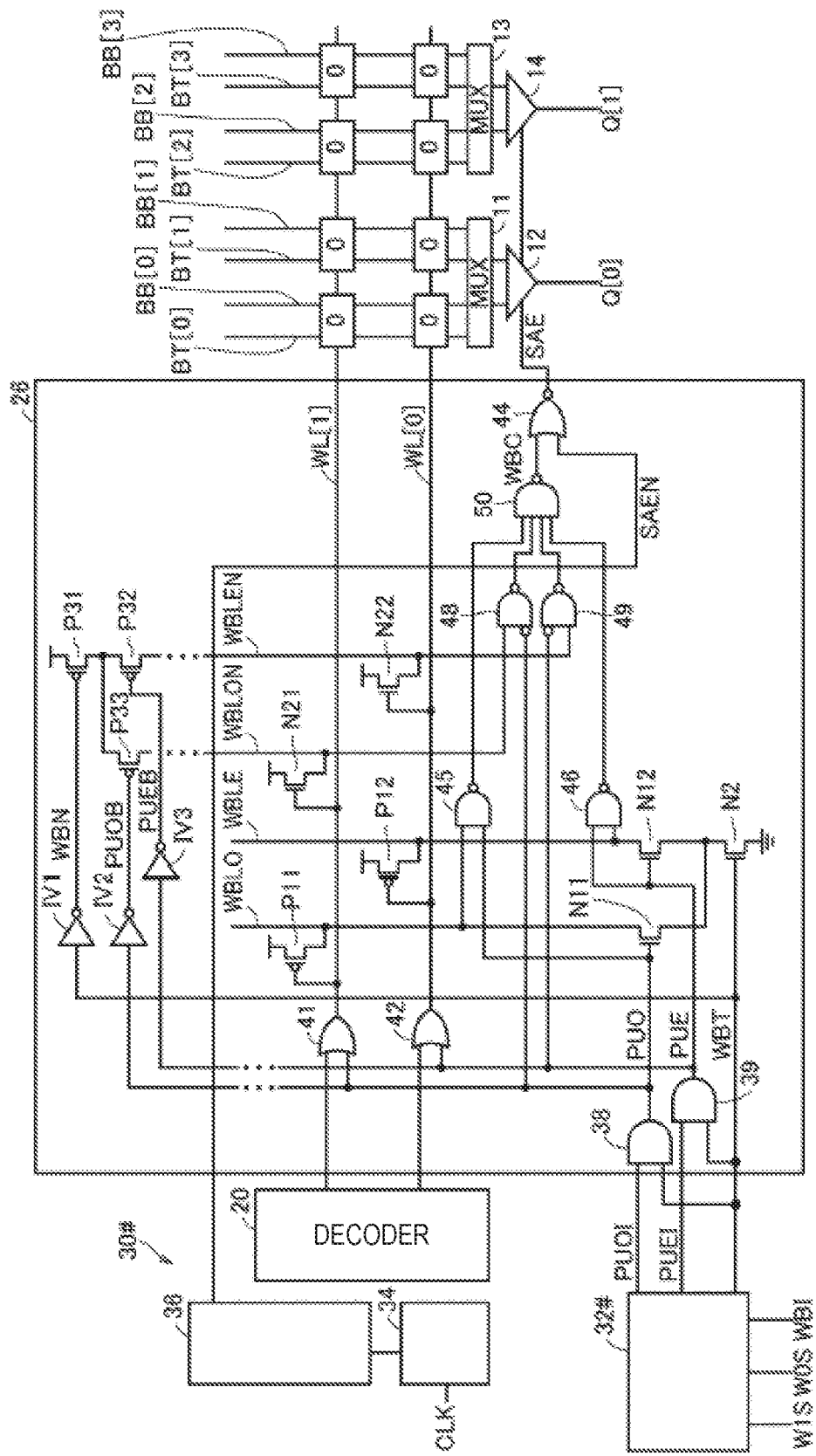
FIG. 10 is a diagram illustrating a configuration of a peripheral circuit of a memory array 10 according to a third embodiment.

In the third embodiment, a circuit configuration capable of detecting the abnormal state will be described. FIG. 10 is a diagram illustrating a configuration of a peripheral circuit of the memory array 10 according to the third embodiment.

Referring to FIG. 10, memory array 10 includes a plurality of memory cells MC in a matrix. In this example, it is assumed that data "0" is stored in advance in a plurality of memory cells MC.

Since the configuration of the I/O circuit 40 is the same as that described in the first embodiment, detailed descriptions thereof will not be repeated.

The control circuit 30# is provided with a burn-in mode control circuit 32#. The burn-in mode control circuit 32# sets the control signal PUE ("H" level) based on the inputs of the command WBI ("H" level) and control signal W0S ("H" level).

The burn-in mode control circuit 32# sets the control signal PUO ("H" level) based on the input of the command WBI ("H" level) and control signal W1S ("H" level).

The semiconductor device according to the third embodiment differs from semiconductor device 1# in that detection circuit 25# is replaced with detection circuit 25.

The detection circuit 25 includes a plurality of OR circuits provided corresponding to the word lines WL respectively, P-channel MOS transistors, detection signal wiring WBLO and WBLE, WBLON, WBLEN, N-channel MOS transistors N2, N11, N12, N21 and N22, a NOR circuit 44, and NAND circuits 45 to 50. The detection circuit 25 includes P-channel MOS transistors P31 to P33, inverters IV1~IV3, and AND circuits 38 and 39.

In this embodiment, OR circuits are separately provided corresponding to word lines of odd rows and even rows, respectively.

For example, the OR-circuit 42, the P-channel MOS transistor P12, and the N-channel MOS transistor N22 are provided corresponding to the word line WL[0] of the even row.

An OR-circuit 41, a P-channel MOS transistor P11, and an N-channel MOS transistor N21 are provided corresponding to the word line WL[1] of the odd row.

The other even row and odd row word lines are similarly provided with OR-circuits, P-channel MOS transistors, and N-channel MOS transistors.

The OR circuits 41 and 42 drive the word lines WLs based on the decode signals from the decoder 20 or the input of the control signal PUO or PUE.

The OR circuit provided corresponding to the word line WL of the odd row sets the odd word line WL of all the word lines WL to rising state in accordance with the input of the control signal PUO ("H" level).

The OR circuit provided corresponding to the word line WL of the even row sets the even word line WL of all the word lines WL to rising state in accordance with the input of the control signal PUE ("H" levels).

The detection signal wiring WBLO is connected to the ground voltage VSS via N-channel MOS transistors N11 and N2 connected in series.

The detection signal wiring WBLE is connected to the ground voltage VSS via N-channel MOS transistors N12 and N2 connected in series.

N-channel MOS transistors N11 and N12 receive inputs of control signal PUO and PUE, respectively.

N-channel MOS transistor N2 receives the input of control signal WBT. The NAND circuit 45 receives the detection signal from the detection signal wiring WBLO and the control signal PUO, and outputs a NAND logical operation result to the NAND circuit 50.

The NAND circuit 46 receives the detected signals from the detection signal wiring WBLE and the control signal PUE, and outputs a result of the NAND logical operation to the NAND circuit 50.

The NAND circuit 48 receives the detected signal from the detection signal wiring WBLON and the inverted signal of the control signal PUO, and outputs a NAND logical operation result to the NAND circuit 50.

The NAND circuit 49 receives the detected signal from the detection signal wiring WBLEN and the inverted signal of the control signal PUE, and outputs a NAND logical operation result to the NAND circuit 50.

The NAND circuit 50 outputs a NAND logical operation result of the output signals of the NAND circuits 45 to 49 as a control signal WBC.

The NOR circuit 44 outputs the NOR logical operation result of the control signal WBC and the control signal SAEN from the signal generation circuit 36 as a control signal SAE.

The P-channel MOS transistor P11 is provided between the power voltage VDD and the detection signal wiring WBLO and the gate is connected to the corresponding odd row word line WL.

The P-channel MOS transistor P12 is provided between the power supply voltage VDD and the detection signal wiring WBLE, and the gate is connected to the word line WL of the corresponding even row.

The N-channel MOS transistor N21 is provided between the power voltage VDD and the detection signal wiring WBLON and the gate is connected to the corresponding odd row word line WL.

N-channel MOS transistor N22 is provided between power supply voltage VDD and detection signal wiring WBLEN, and the gate is connected to the word line WL of the corresponding even row.

One side of the detection signal wiring WBLON is connected to P-channel MOS transistors P31 and P33 provided between the voltage WBLON and the power supply voltage VDD. The other side of the detection signal wiring WBLON is connected to an input of a NAND circuit 48.

One side of the detection signal wiring WBLEN is connected to P-channel MOS transistors P31 and P32 provided between the voltage WBLEN and the power supply voltage VDD. The other side of detection signal wiring WBLEN is connected to an input of NAND circuit 49.

The gate of the P-channel MOS transistor P31 receives the inverted signal WBN via the inverter IV1 of the control signal WBT. When the control signal WBT is at the "H" level, the inverted signal WBN is set to the "L" level. Therefore, the P-channel MOS transistor P31 is turned on.

The gate of the P-channel MOS transistor P32 receives the input of the inverting signal PUEB through the inverter IV3 of the control signal PUE. When the control signal PUE is at the "H" level, the inverted signal PUEB is set to the "L" level. Therefore, the P-channel MOS transistor P32 is turned on. When P-channel MOS transistors P31 and P32 are turned on, detection signal wiring WBLEN is set to "H" level. When the N-channel MOS transistor N22 is turned on even when the P-channel MOS transistor P32 is not turned on, the detection signal wiring WBLEN is set to the "H" level.

The gate of the P-channel MOS transistor P33 receives the input of the inverting signal PUOB through the inverter IV2 of the control signal PUO. When the control signal PUO is at the "H" level, the inverted signal PUOB is set to the "L" level. Therefore, the P-channel MOS transistor P33 is turned on. When P-channel MOS transistors P31 and P33 are turned on, detection signal wiring WBLON is set to "H" level. When the N-channel MOS transistor N21 is turned on even when the P-channel MOS transistor P33 is not turned on, the detection signal wiring WBLON is set to the "H" level.

The AND circuit 38 receives the inputs of the control signal WBT and the control signal PUOI, and outputs an AND logical operation result as a control signal PUO.

The AND circuit 39 receives the inputs of the control signal WBT and the control signal PUOE, and outputs an AND logical operation result as a control signal PUE.

In this example, the burn-in operation for the word lines WL[0] and WL[1] will be described.

Figure 11:
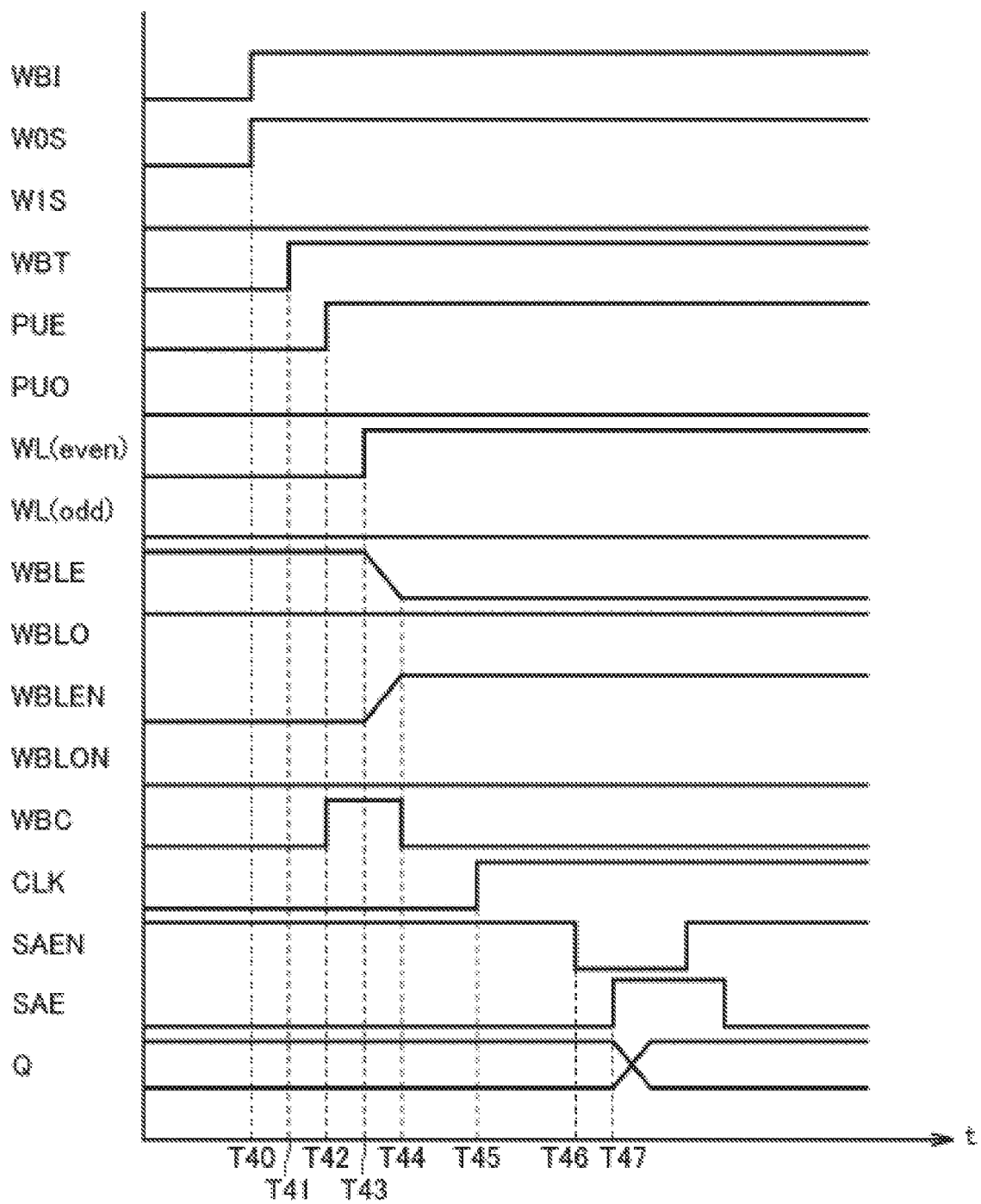
FIG. 11 is a timing chart illustrating a burn-in operation (normal operation) of a semiconductor device according to the third embodiment.

FIG. 11 is a timing chart for explaining the burn-in operation (normal operation) of the semiconductor device according to the third embodiment.

Referring to FIG. 11, at time T40, burn-in mode control circuit 32 receives commands WBI and control signal W0S.

At time T41, the burn-in mode control circuit 32 sets the control signal WBT to the "H" level in accordance with the inputs of the commands WBI ("H" level) and control signal W0S ("H" level). Although not shown, the control signal PUEI is set to "H" level.

At time T42, the AND-circuit 39 sets the control signal PUE to the "H" level based on the control signal WBT ("H" level) and the control signal PUEI ("H" level). Control signal PUO maintains "L" levels.

In response to this, the NAND circuit 46 outputs an "L" level signal to the NAND circuit 50 based on a NAND logical operation result between the detected signal of the detection signal wiring WBLE and the control signal PUE.

The NAND circuit 50 sets the control signal WBC ("H" level) in accordance with the input of the "L" level signal from the NAND circuit 46.

At time T43, the OR circuit 42 sets the word line WL[0] ("H" level) corresponding to even row in accordance with the control signal PUE ("H" level). That is, the even row word line WL of all the word lines WL are set to rising state.

Accordingly, the P-channel MOS transistor P12 is turned off. In this instance, since the control signal PUE and WBT are set to "H" levels, the detection signal wiring WBLE is connected to the ground voltage VSS.

On the other hand, the N-channel MOS transistor N22 is turned on. After the time T43, the detection signal wiring WBLE gradually starts to fall to the "L" level. On the other hand, detection signal wiring WBLEN gradually starts rising to "H" level.

At time T44, the NAND circuit 46 outputs an "H" level signal to the NAND circuit 50 based on the result of the NAND logical operation between the detection signal according to the potential of the detection signal wiring WBLE and the control signal PUE. The NAND circuit 49 outputs an "H" level signal to the NAND circuit 50 based on the result of the NAND logical operation between the detected signal according to the potential of the detection signal wiring WBLEN and the inverted signal of the control signal PUE. The NAND circuit 48 outputs an "H" level signal to the NAND circuit 50 based on the NAND logical operation result of the detected signal according to the potential of the detection signal wiring WBLON and the inverted signal of the control signal PUO. The NAND circuit 45 outputs an "H" level signal to the NAND circuit 50 based on the result of the NAND logical operation between the detection signal according to the potential of the detection signal wiring WBLO and the control signal PUO. The NAND circuit 50 receives "H" level signals from the NAND circuits 45, 46, 48, and 49, and outputs control signal WBCs ("L" level signals).

At time T45, the clock signal CLK is set to "H" level. Accordingly, at time T46, the signal generation circuit 36 sets the control signal SAEN to "L" level.

Accordingly, at time T47, the NOR circuit 44 outputs the control signal SAE (H level) based on the NOR logical operation result of the control signal SAEN (L level) and the control signal WBC (L level).

The sense amplifiers 12 and 14 output the read data Q[0] and the read data Q[1] based on the input of the control signal SAE ("H" levels).

Figure 12:
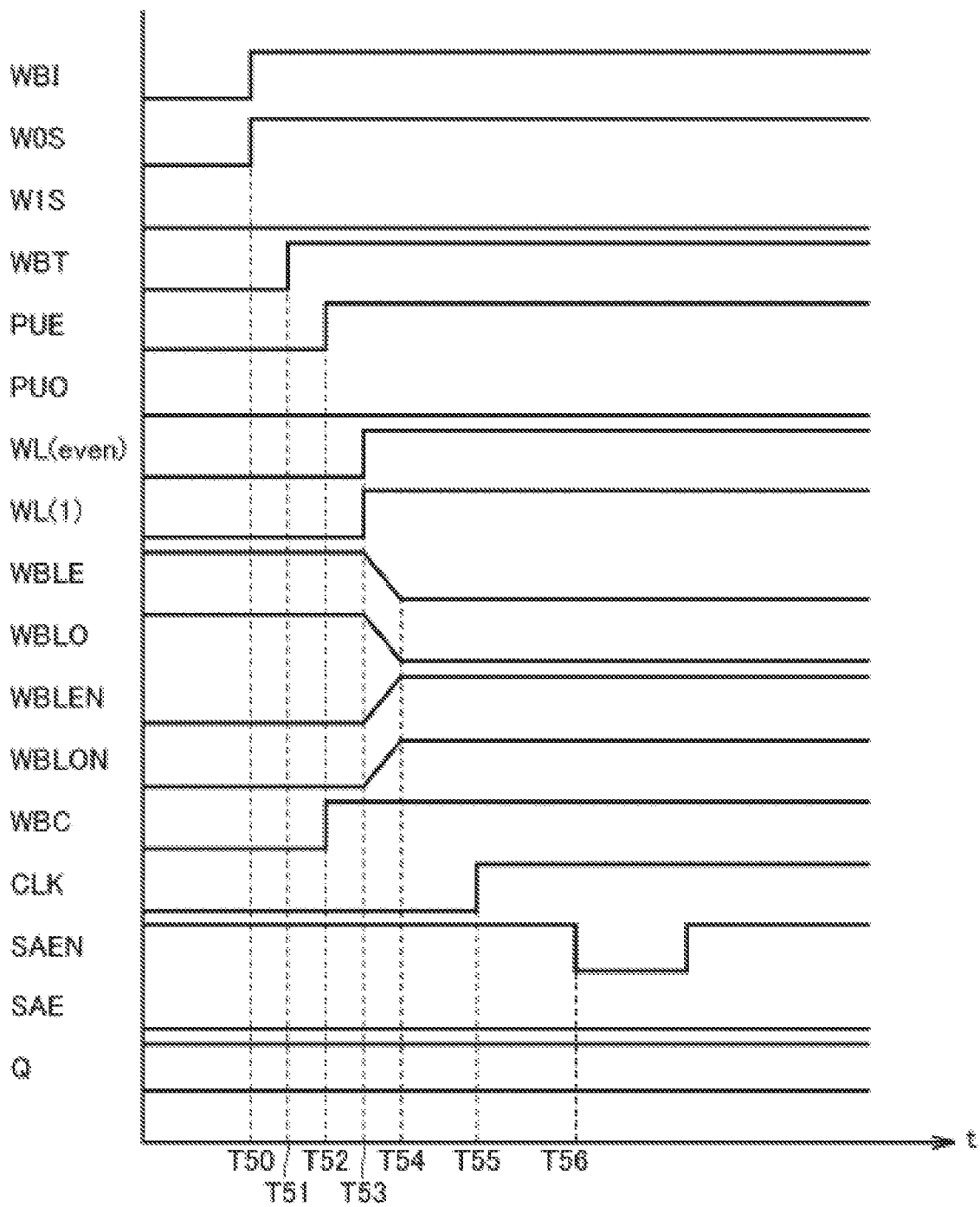
FIG. 12 is a timing chart illustrating a burn-in operation (abnormal operation) of a semiconductor device according to the third embodiment.

In this example, data "0" is output. FIG. 12 is a timing chart for explaining the burn-in operation (abnormal operation) of the semiconductor device according to the third embodiment.

Referring to FIG. 12, at time T50, burn-in mode control circuit 32 receives commands WBI and control signal W0S.

At time T51, the burn-in mode control circuit 32 sets the control signal WBT to the "H" level in accordance with the inputs of the commands WBI ("H" level) and control signal W0S ("H" level). Although not shown, the control signal PUEI is set to "H" level.

At time T52, the AND-circuit 39 sets the control signal PUE to the "H" level based on the control signal WBT ("H" level) and the control signal PUEI ("H" level). Control signal PUO maintains "L" level.

In response to this, the NAND circuit 46 outputs an "L" level signal to the NAND circuit 50 based on the NAND logical operation result between the detected signal of the detection signal wiring WBLE and the control signal PUE.

The NAND circuit 50 sets the control signal WBC ("H" level) in accordance with the input of the "L" level signal from the NAND circuit 46.

At time T53, the OR circuit 42 sets the word line WL[0] ("H" level) corresponding to even row in accordance with the control signal PUE ("H" level). That is, the even row word line WL of all the word lines WL are set to rising state.

On the other hand, the word line WL[1] is rising state. The odd row word line WL is loaded by abnormality.

Accordingly, the N-channel MOS transistor N21 is turned on. After time T53, detection signal wiring WBLE gradually starts to fall to "L" level. On the other hand, detection signal wiring WBLEN gradually starts rising to "H" level.

When the N-channel MOS transistor N21 is turned on, the detection signal wiring WBLON gradually starts rising to the "H" level.

At time T54, the NAND circuit 46 outputs an "H" level signal to the NAND circuit 50 based on the result of the NAND logical operation between the detection signal according to the potential of the detection signal wiring WBLE and the control signal PUE. The NAND circuit 49 outputs an "H" level signal to the NAND circuit 50 based on the result of the NAND logical operation between the detected signal according to the potential of the detection signal wiring WBLEN and the inverted signal of the control signal PUE. The NAND circuit 48 outputs an "L" level signal to the NAND circuit 50 based on the NAND logical operation result of the detected signal according to the potential of the detection signal wiring WBLON and the inverted signal of the control signal PUO. The NAND circuit 45 outputs an "H" level signal to the NAND circuit 50 based on the result of the NAND logical operation between the detection signal according to the potential of the detection signal wiring WBLO and the control signal PUO. The NAND circuit 50 receives the signal of the "L" level from the NAND circuit 46 and maintains the signal of the control signal WBC (the signal of the "H" level).

Next, at time T55, the clock signal CLK is set to "H" level. Accordingly, at time T55, the signal generation circuit 36 sets the control signal SAEN to "L" level.

However, the NOR circuit 44 outputs the control signal SAE ("L" level) based on the NOR logical operation result of the control signal SAEN ("L" level) and the control signal WBC ("H" level).

Therefore, sense amplifiers 12 and 14 are not activated and read data Q[0] and Q[1] are not output.

Although the burn-in operation for the even row word lines WL has been described above, the same applies to the odd row word lines WL.

Therefore, by using the detection circuit 25 according to the fourth embodiment, when there is an abnormality in the burn-in operation for the word line WL of the odd row or even row the control signal, SAE for activating the sense amplifier is not activated. As a result, it can be easily detected that the burn-in operation is not normal because the read data is not outputted from the sense amplifier.

In addition, as in the present configuration, the abnormal condition of the burn-in operation is the burn-in operation for the word line WL of the even row. However, it is easy to detect that the burn-in operation is not normal because abnormality can be detected when a load is applied to the word line WL of the odd row. In this embodiment, although the configuration has been described in which the application of a load to the odd row word line WL is detected despite the burn-in operation to the even row word line WL. On the contrary, the application of a load to the even row word line WL can also be detected despite the burn-in operation to the odd row word line WL.

Fourth Embodiment

In the above-described configuration, when data "0" is stored in the plurality of memory cells MC, the data "1" may be stored. Further, a predetermined data pattern may be stored in advance in a plurality of memory cells MC.

Figure 13:
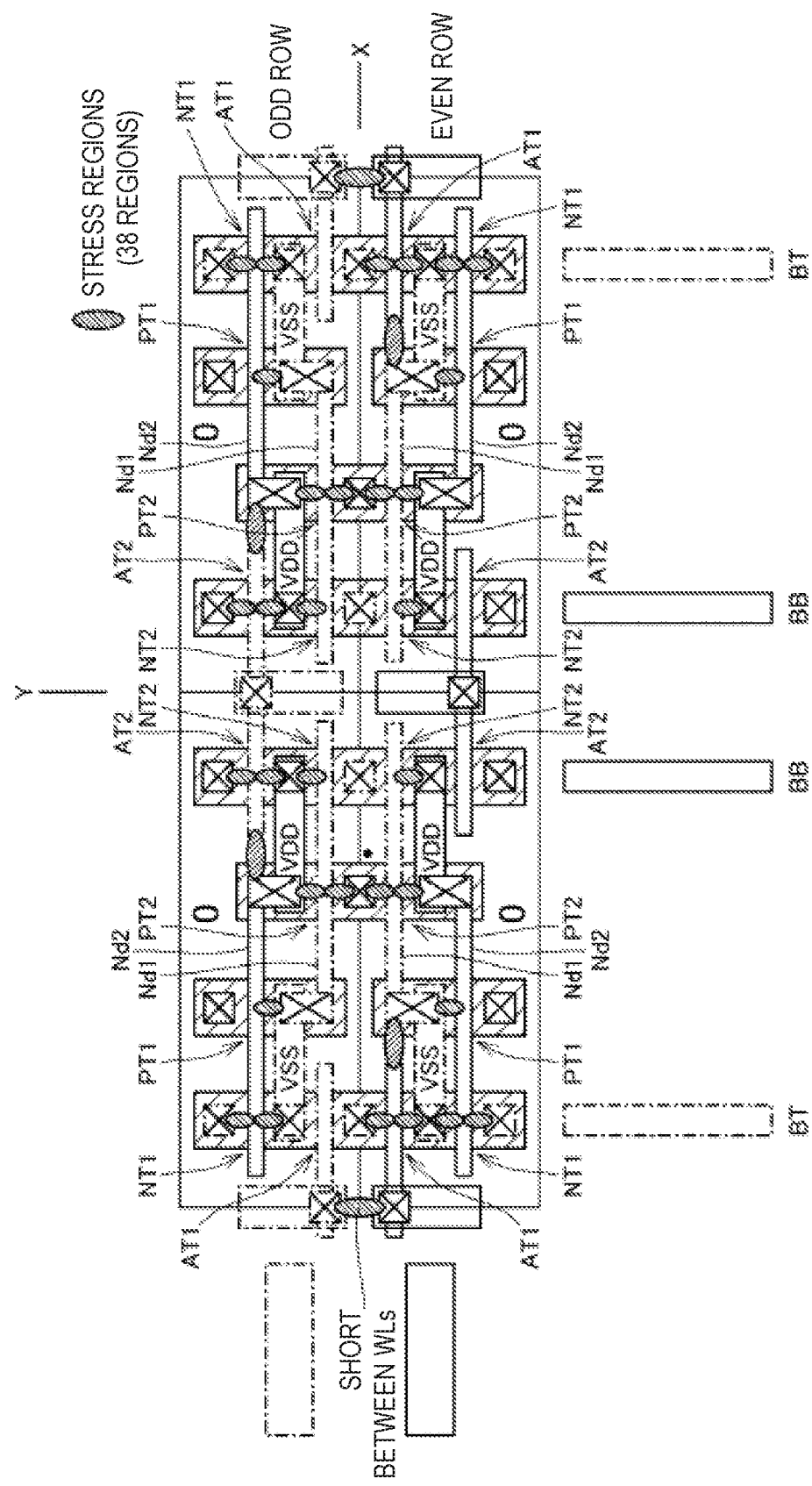
FIG. 13 is a diagram illustrating how a load is applied in a cell layout when the data "0" according to the fourth embodiment is stored in a memory cell MC.

FIG. 13 is a diagram for explaining how a load is applied in the cell layout when the data "0" is stored in the memory cell MC according to the fourth embodiment.

Referring to FIG. 13, the cell layout of four adjacent memory cells MC is shown. The arrangement is symmetrical with respect to the X direction and the Y direction.

Here, a case where data "0" is stored in all the memory cells MC will be described. In this case, it is assumed that the N-channel MOS transistor NT1 and the P-channel MOS transistor PT2 are turned on in the respective memory cells MC. As a result, the node Nd1 is latched at the "L" level, and the node Nd2 is latched at the "H" level.

In this embodiment, the burn-in operation is performed on the even row word line WL, and the odd row word line WL is not loaded.

Figure 14:
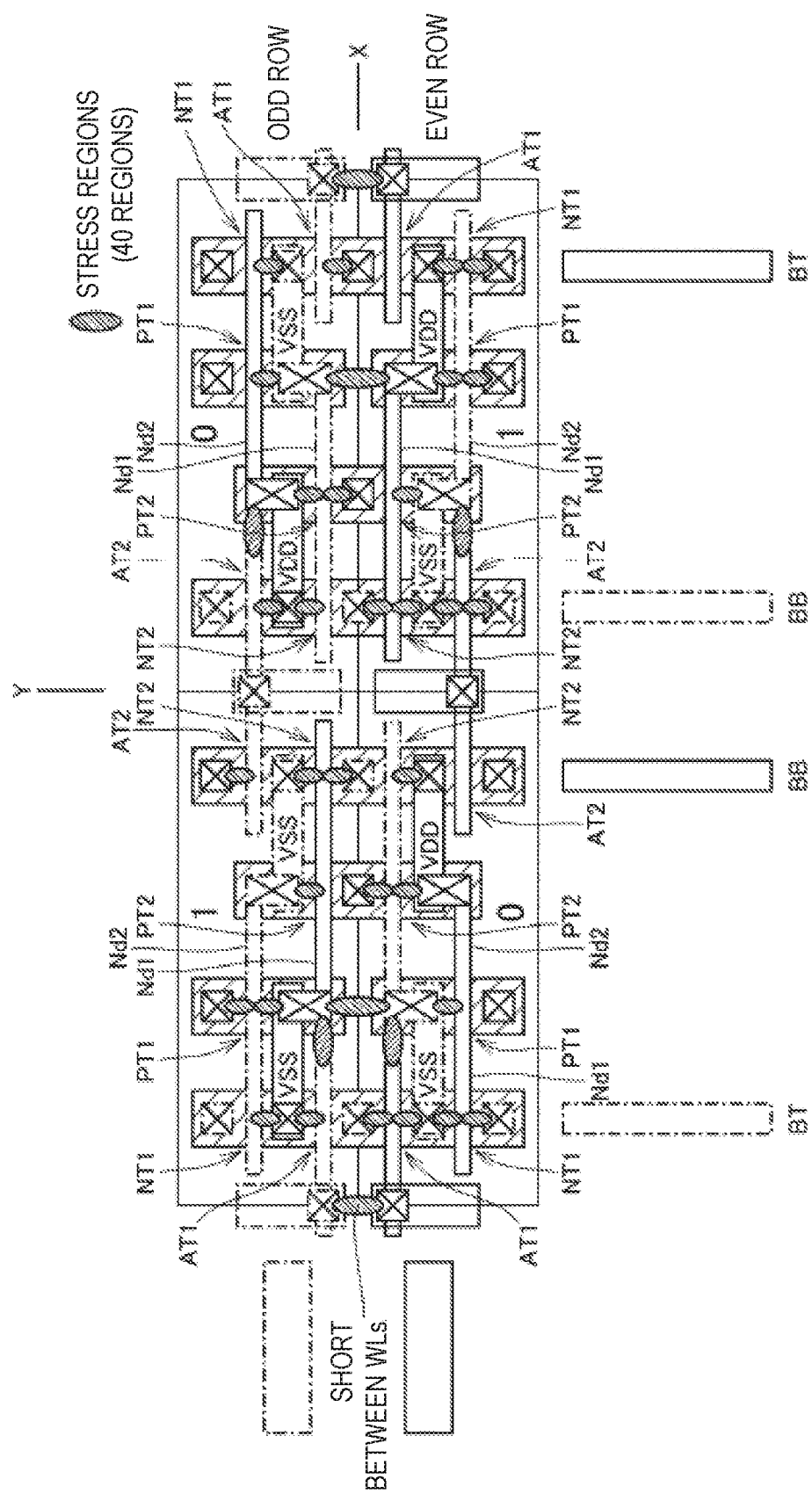
FIG. 14 is a diagram illustrating how a load is applied in cell layouts when data "0" and data "1" are stored in a hounds-tooth pattern in memory cells MC according to the fourth embodiment.

In this case, 38 regions are loaded by the burn-in operation. FIG. 14 is a diagram for explaining how a load is applied in cell layouts when the data "0" and the data "1" are stored in the memory cell in a hounds-tooth pattern according to the fourth embodiment.

Referring to FIG. 14, the cell layout of four adjacent memory cells MC is shown. The arrangement is symmetrical with respect to the X direction and the Y direction.

Here, the case where the data "0" and the data "1" are stored in a hounds-tooth pattern of the memory cell MC will be described. The data stored in the memory cells MC adjacent to each other in the X direction and the Y direction are different from each other. Therefore, in any memory cell column, the data of the memory cells MC of the odd row and the even row are the same data.

In this case, it is assumed that the N-channel MOS transistor NT1 and the P-channel MOS transistor PT2 are turned on in the memory cell MC storing the data "0". As a result, the node Nd1 is latched at the "L" level, and the node Nd2 is latched at the "H" level.

It is assumed that the N-channel MOS transistor NT2 and the P-channel MOS transistor PT1 are turned on in the memory cell MC storing the data "1". As a result, the node Nd2 is latched at the "L" level, and the node Nd1 is latched at the "H" level.

In this embodiment, the burn-in operation is performed on the even row word line WL, and the odd row word line WL is not loaded.

In this case, 40 regions are loaded by the burn-in operation. Since the data held in the adjacent memory cells MC are different from each other, it is possible to apply a load to the short-circuit defect.

Therefore, by storing the data in the hounds-tooth pattern, a more reliable check can be performed.

Fifth Embodiment

Figure 15:
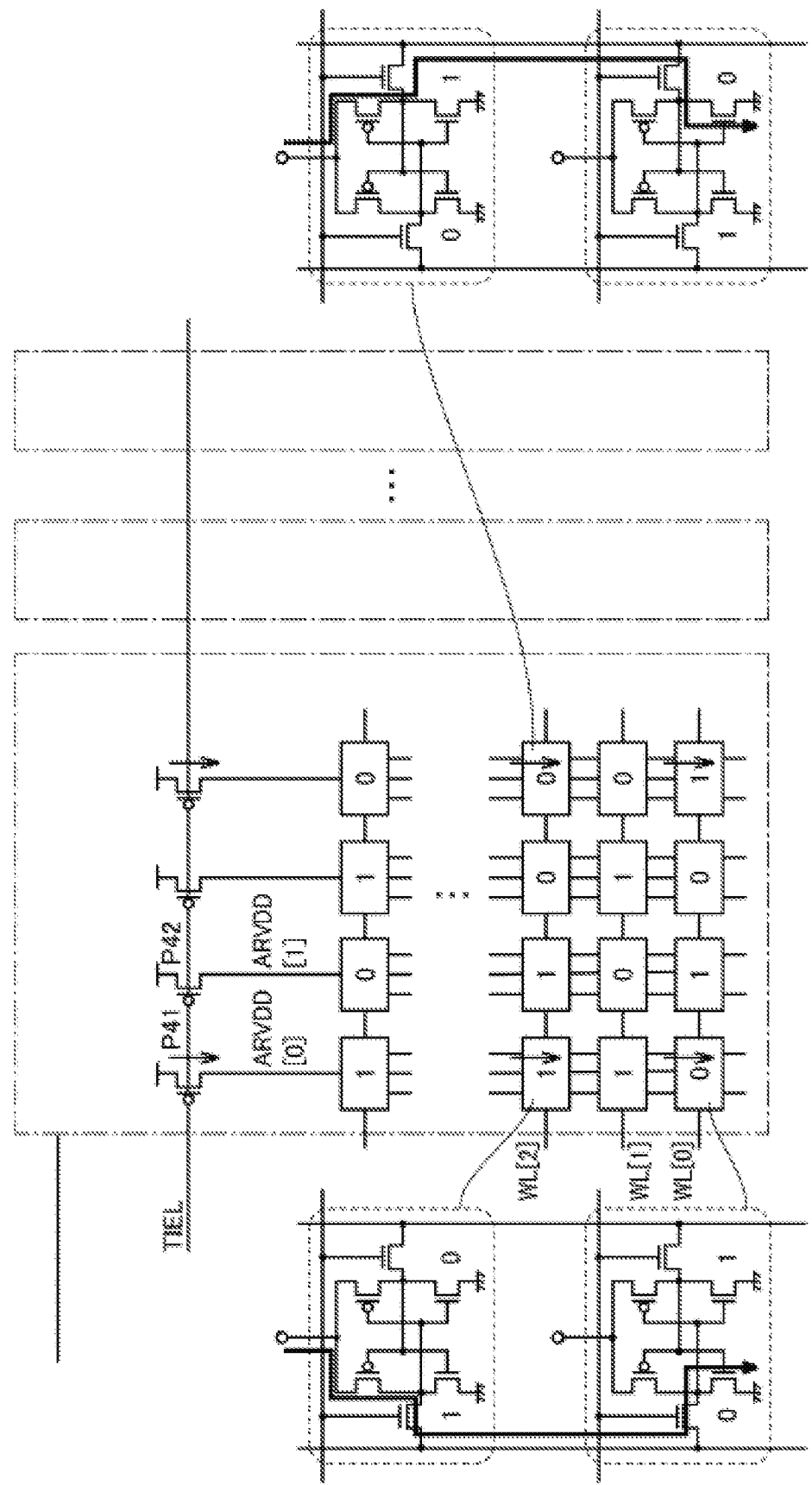
FIG. 15 is a diagram illustrating a through current in a conventional burn-in operation.

FIG. 15 is a diagram illustrating a through current in a conventional burn-in operation.

Referring to FIG. 15, data "0" and data "1" of a plurality of memory cells MC are mixed in even row or odd row.

In this case, the case where the burn-in operation is performed on the word line WL of the even row will be described.

In this case, through current flows from the memory cell MC storing the data "1" to the memory cell MC storing the data "0" via the bit line BT.

In addition, through current flows from the memory cell MC storing the data "0" to the memory cell MC storing the data "1" via the bit line BB.

Therefore, a large through current flows through the bit lines BT and BB by executing the burn-in operation in accordance with the stored data.

In the above embodiment, all the data stored in the memory cell MC is stored in "0" or "1" or in a hounds-tooth pattern.

In this case, since the bit lines BT and BB are set to the same potential node, through current does not flow.

On the other hand, even when all the memory cells MC of the memory array are stored in the same data or in a hounds-tooth pattern, the above-mentioned problems occur when a problem occurs in the write data.

In the fifth embodiment, a method in which the through current can be suppressed even when through current occurs will be described.

Figure 16:
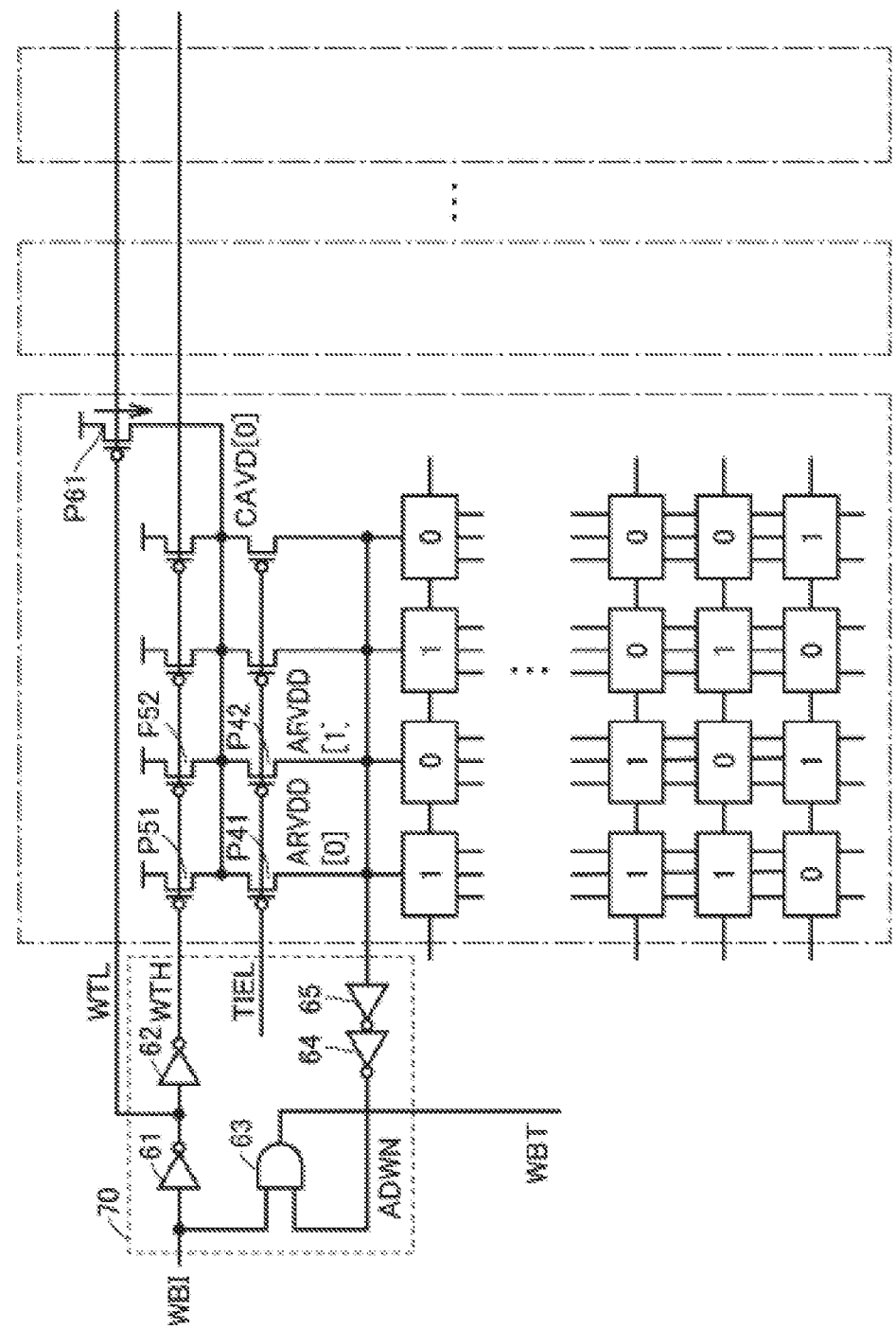
FIG. 16 is a diagram illustrating a configuration of a memory array according to a fifth embodiment.

FIG. 16 is a diagram illustrating a configuration of a memory array according to the fifth embodiment. Referring to FIG. 16, the memory array includes a plurality of memory cells MC arranged in a plurality of rows and columns. A power supply unit for the memory cells MC is provided for each column.

As an example, the power supply unit is comprised of two P-channel MOS transistors connected in series.

P-channel MOS transistors P41 and P51 are provided in the first column. P-channel MOS transistors P52 and P42 are provided in the second column. P-channel MOS transistors P51 and P52 receive the input of control signal WTH. The P-channel MOS transistors P41 and P42 receive input of control signal TIEL.

The P-channel MOS transistors P51 and P52 are turned on in accordance with the input of the control signal WTH ("L" level). The P-channel MOS transistors P41 and P42 are turned on in accordance with the input of the control signal TIEL ("L" levels).

A P-channel MOS transistor P61 is provided as a power supply unit for testing.

The P-channel MOS transistor P61 is connected in parallel with the P-channel MOS transistors P41 and P42. The P-channel MOS transistor P61 receives the control signal WTL. The operating current of the P-channel MOS transistor P61 is small.

The P-channel MOS transistor P61 is turned on in accordance with the control signal WTL (L-level).

The burn-in control circuit includes a protection circuit 70. The protection circuit 70 includes inverters 61 to 65 and an AND-circuit 63.

Inverter 61 and inverter 62 are connected in series and receive the input of control signal WBI.

Inverter 61 outputs control signal WTL obtained by inverting the input signal of control signal WBI. When the control signal WBI is set to the "H" level, the control signal WTL is set to the "L" level.

As the control signal WBI is set to the "H" level, the control signal WTH is set to the "H" level. In this case, the P-channel MOS transistors P51 and P52 are turned off. On the other hand, the P-channel MOS transistor 61 is turned on.

Therefore, the testing power supply unit and the normal power supply unit can be switched according to the input of the control signal WBI.

In normal operation and testing operation, control signal TIEL is set to "L" level.

The AND circuit 63 outputs a control signal WBT based on an AND logical operation result of the control signal WBI and the control signal ADWN.

The inverters 64 and 65 are connected to the power supply nodes of the respective power supply units. Then, control signal ADWN corresponding to the potential of the power supply node of each of the power supply units is outputted.

Therefore, the potential of the power supply node is initially set to the "H" level. On the other hand, when the potential of the power supply nodes decreases, the control signal ADWN is set to "L" level.

Therefore, when through current occurs, the potential of the power supply node drops, so that the power supply node outputs control signal ADWN ("L" level). In this instance, the AND-circuit 63 outputs a control signal WBT of "L" level.

Thus, even if the burn-in operation is executed once, if through current occurs, the control signal WBT is set to the "L" level according to the control signal ADWN ("L" level). As a result, as described above, the control signal PU is set to the "L" level, so that the burn-in operation can be stopped. The same applies to control signals PUO and PUE.

Further, in the present embodiment, in the case of the burn-in operation, since the power supply unit for testing is used in accordance with the control signal WBI, even if through current occurs, the large through current can be suppressed from flowing.

In the above description, the configuration in the case where a defect occurs in the write data to the memory cell MC of the memory array has been described, but the present invention is not particularly limited thereto, and is also applicable to the case where the burn-in operation is performed before the write data is written.

Although the present disclosure has been specifically described based on the embodiments described above, the present disclosure is not limited to the embodiments, and it is needless to say that various modifications can be made without departing from the gist thereof.

What is claimed is:

1. A semiconductor device comprising:
   a plurality of memory cells arranged in a matrix;
   a plurality of word lines provided corresponding to each of rows of the plurality of memory cells respectively;
   a detection circuit raising the plurality of word lines by a test operation and detecting whether a rising state of the plurality of word lines is normal; and
   a reading circuit that reads data from one memory cell of the plurality of memory cells,
   wherein, in a case that the rising state of the plurality of word lines is normal, the detection circuit sets on a signal activating the reading circuit, and
   wherein, in a case that the rising state of the plurality of word lines is abnormal, the detection circuit sets off the signal activating the reading circuit.

2. The semiconductor device according to claim 1, wherein the detection circuit further includes:
   a detection signal wiring that detects the rising state of the plurality of word lines; and
   a plurality of detection transistors provided to the plurality of word lines respectively and provided between the detection signal wiring and a first voltage, such that each gate of one of the plurality of detection transistors is connected to a corresponding word line,
   wherein the detection signal wiring is connected to a second voltage by the test operation, and
   wherein, in a case that a rising state of at least one word line of the plurality of word lines is abnormal, a corresponding detection transistor of the plurality of detection transistors is turned on.

3. The semiconductor device according to claim 2, further comprising a setting circuit to set the signal activating the reading circuit based on a voltage of the detection signal wiring and a control signal.

4. The semiconductor device according to claim 1, wherein the detection circuit further includes:
   a first detection signal wiring that detects a rising state of odd rows of the plurality of word lines;
   a second detection signal wiring that detects a rising state of even rows of the plurality of word lines;
   a plurality of first detection transistors provided corresponding to odd rows of the plurality of word lines respectively and provided between the first detection signal wiring and a first voltage, such that each gate of one of the plurality of detection transistors is connected to a corresponding word line; and a plurality of second detection transistors provided corresponding to even rows of the plurality of word lines respectively and provided between the second detection signal wiring and the first voltage, such that each gate of one of the plurality of detection transistors is connected to a corresponding word line, wherein the first or second detection signal wiring is connected to a second voltage by the test operation, and wherein in a case that a rising state of at least one word line of the plurality of word lines is abnormal, a corresponding detection transistor the plurality of detection transistors is turned on.

5. The semiconductor device according to claim 4, wherein the detection circuit further includes:

a plurality of third detection transistors provided corresponding to even rows of the plurality of word lines respectively, and detecting an abnormality of even rows of the plurality of word lines when the odd rows of the plurality of word lines are in a rising state; and a plurality of fourth detection transistors provided corresponding to odd rows of the plurality of word lines respectively, and detecting an abnormality of odd rows when the even rows of the plurality of word lines are in a rising state.

6. The semiconductor device according to claim 1, wherein first data and second data are stored in the plurality of memory cells in a hounds-tooth pattern.

7. A semiconductor device comprising:
a plurality of memory cells arranged in a matrix;
a plurality of word lines provided corresponding to each of rows of the plurality of memory cells respectively; and
a detection circuit raising the plurality of word lines by a test operation and detecting whether a rising state of the plurality of word lines is normal,
wherein the detection circuit includes:
a protection circuit that suppresses a through current to at least one memory cell of the plurality of memory cells in the test operation.

8. The semiconductor device according to claim 7, wherein the protection circuit includes a test power supply unit to supply the plurality of memory cells with electric power.

9. The semiconductor device according to claim 7, wherein the protection circuit further includes a stop circuit to stop the test operation.

10. The semiconductor device according to claim 1, further comprising a decoder to generate a driving signal for driving the plurality of word lines,
wherein the detection circuit is provided between the plurality of word lines and the decoder.

11. The semiconductor device according to claim 1, wherein the detection circuit rises all of the plurality of word lines by a test operation and detecting whether or not the rising state of all of the plurality of word lines is normal.

12. The semiconductor device according to claim 1, wherein the detection circuit rises the plurality of word lines simultaneously by a test operation and detecting whether or not the rising state of the plurality of word lines is normal.

* * * * *